United States Patent
Sesek et al.

(10) Patent No.: US 7,221,487 B2
(45) Date of Patent: May 22, 2007

(54) OPTICAL SCANNING DEVICE HAVING SELECTABLE IDENTIFIABLE SCAN WINDOW

(75) Inventors: Robert Sesek, Boise, ID (US); Christian L. Struble, Boise, ID (US); J. Michael Dunlap, Horseshoe Bend, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 832 days.

(21) Appl. No.: 09/938,893

(22) Filed: Aug. 24, 2001

(65) Prior Publication Data

US 2003/0038227 A1    Feb. 27, 2003

(51) Int. Cl.
*H04N 1/04*     (2006.01)

(52) U.S. Cl. .................. 358/488; 358/486; 358/497; 358/474

(58) Field of Classification Search ........... 358/488, 358/486, 497, 474, 453
See application file for complete search history.

(56) References Cited

U.S. PATENT DOCUMENTS

| 4,268,164 | A | * | 5/1981 | Yajima et al. ............. 355/41 |
| 4,371,898 | A | * | 2/1983 | Nakamura ................ 358/300 |
| 4,518,999 | A | * | 5/1985 | Kurata et al. ............ 358/488 |
| 4,666,288 | A |   | 5/1987 | Watanabe |
| 4,687,317 | A |   | 8/1987 | Appel et al. |
| 4,720,729 | A |   | 1/1988 | Watanabe |
| 4,737,804 | A |   | 4/1988 | Ayata et al. |
| 4,967,235 | A |   | 10/1990 | Sanbayashi |
| 4,985,778 | A | * | 1/1991 | Ayata et al. ............. 358/296 |
| 5,153,645 | A | * | 10/1992 | Hasegawa et al. ......... 399/183 |

FOREIGN PATENT DOCUMENTS

JP    2000-358131    * 12/2000

OTHER PUBLICATIONS

British Seach Report dated Jan. 22, 2003.

* cited by examiner

*Primary Examiner*—Jerome Grant
*Assistant Examiner*—Houshang Safaipour

(57) ABSTRACT

A scan window apparatus for defining and identifying a selected scan window within an overall scanable surface of a scanning device. The scanable surface is defined by intersecting first and second edges. The scan window apparatus includes moveable position markers which can be moved along the first and second edges of the scanable surface to thereby define the selected scan window. A scan window illumination device is used to illuminate the selected scan window. The illumination device can be a light source directed towards the scanable surface, or a directed, focused light source to trace at least a portion of a perimeter which defines the scan window. The invention also provides for an optical scanning device having a platen, a scan window identification device allowing a user to define a selected scan window on the platen, and a scan window illumination device to illuminate the selected scan window.

10 Claims, 13 Drawing Sheets

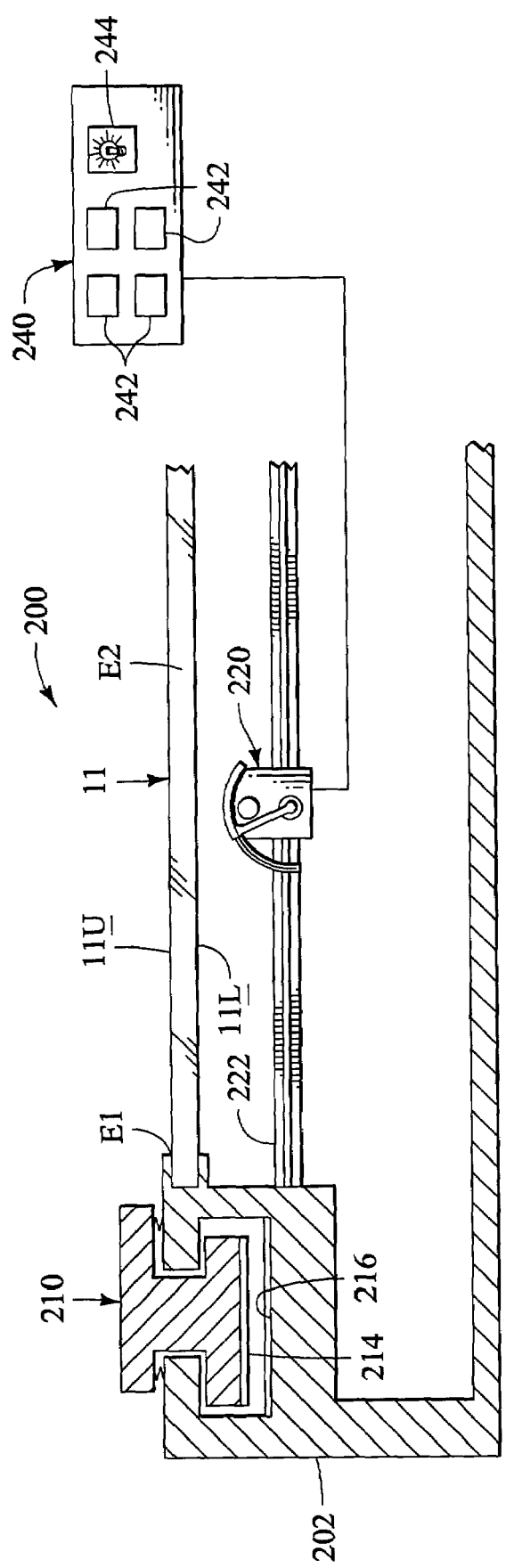
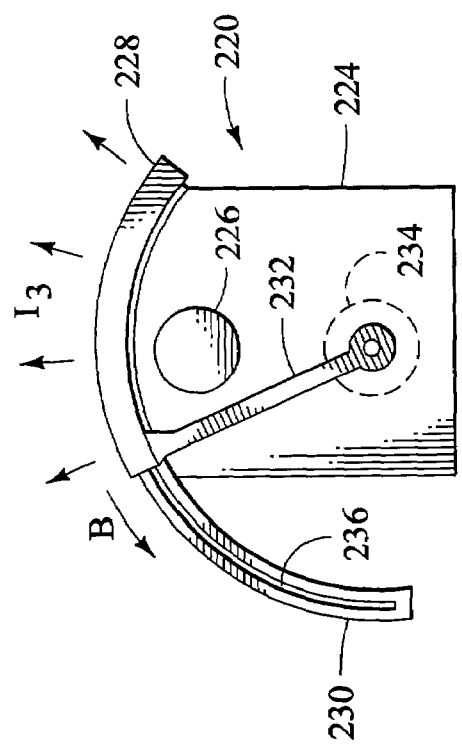
FIG.7
FIG.8

OPTICAL SCANNING DEVICE HAVING SELECTABLE IDENTIFIABLE SCAN WINDOW

FIELD OF THE INVENTION

The invention claimed and disclosed herein pertains to optical scanners, such as flat-bed document scanners, configured to optically scan a scan surface. The invention further pertains to methods and apparatus for allowing a user to define a specific area of the scan surface to be scanned, and to methods and apparatus to facilitate visual identification of the defined area.

BACKGROUND OF THE INVENTION

The present invention pertains to optical scanning devices, such as document scanners. We will use the expression "document scanner" or "scanner" to refer to such devices, although it is understood that objects other than documents can be scanned with such devices. For example, one side of a three dimensional object, such as a sculpture, can frequently be scanned by an optical scanning device. Further, the scanner can be a separate device used to scan documents and the like, or it can be a component of an imaging device such as a photocopier or a facsimile machine. Further, the optical scanner can be a component in a multi-function printer, which can perform two or more different functions (such as printing a document, sending and receiving facsimiles, producing photocopies, and scanning a document). The scanner can be used as a component in a digital imaging device, or an analog imaging device. Accordingly, the expression "document scanner" as used herein should not be considered as meaning only a stand-alone document scanning apparatus, but any optical scanning system used as part of an image processing device.

Optical document scanners are well known in the art, and are frequently used to scan a document containing text and, or, images such as photographs. The object to be scanned is typically positioned on the top side of a transparent (typically glass) platen. One or more scanning light bars are then moved over the bottom side of the platen, and light from the light bar is reflected by the object being scanned to a series of sensors, or to an optical photoconductor. Since dark areas of the object will normally reflect less light than light colored areas of the object, the sensors can record the light and dark patterns of the object. The data from the sensors can be stored as a digital file, thereby producing an electronic, digital "copy" of the side of the object which has been scanned by the optical scanner. In the case wherein the light is reflected to an optical photoconductor ("OPC"), a toner material can then be used to transfer a copy of the scanned image from the OPC to a sheet of media such as paper. In a color scanning process, the light bar(s) may be scanned over the image a number of times to record light reflected from the object at different wavelengths. Further, in some imaging devices (a facsimile machine, for example) the light source remains stationary while the document is moved past the light source by a series of powered rollers.

Typically, a user can use an applications program to view and edit the digital file of the scanned object. The applications program ("software") allows the digital file to be visually presented to the user on a computer monitor or the like. A number of different operations can typically be performed on the file via the applications program to enhance the file's value to the user. For example, the user can edit or "crop" the scanned image as displayed on the monitor to thereby delete unwanted or unnecessary parts of the scanned image which the user does not need. For example, a user may wish to scan a portion of the page of a newspaper to thereby acquire a digital copy of an article of interest to the user. The text and images in articles and advertisements surrounding the article of interest may be of no interest to the user. Accordingly, the user will normally lay the portion of the newspaper containing the article of interest on the platen of the scanner and will then press a button to begin the scanning process. The scanner will scan not only the article of interest, but any collateral material which is also present on the scanner platen. The user can afterwards use the scanner applications program to delete the unwanted parts of the scanned image.

This prior art method of allowing a user to acquire a selected portion of an overall scanned image has some problems. For example, when an applications program is used, the entire file of the scanned image must be processed, consuming valuable computer resources and increasing the length of time required for the editing process. Further, if the document was not carefully laid on the scanner platen in a preferred orientation prior to the scanning process, the scanned image may need to be manipulated (rotated, for example) to allow the cropping process to crop only the undesired portion of the scanned image. As can also be appreciated, unless an applications program is available to manipulate a digital image or the scanned object, or a copy of the scanned image is generated, then the user may not even know if the desired area of interest was scanned or not. This situation can arise for example when a user desired to send a facsimile containing only a portion of a document.

As an alternative to using an applications program to crop the scanned image the user can block out the unwanted portions of the original document prior to scanning the document, as for example by applying paper over the unwanted portions. Another alternative is for the user to cut the desired portion out of the original manuscript and thus scan only the portion of interest. These alternatives have obvious drawbacks. Firstly, blocking out unwanted portions of the document takes time, may not effectively block the unwanted portions, and may also damage the original document if tape or the like is used to hold the blocking material in place. The alternative, i.e, cutting the desired portion out of the original document, may not be a viable option in many cases, as it will damage the original document. An alternative to cutting the original manuscript is to make a full copy of the original manuscript (such as a page of a book), and then to cut the desired portion out of the copy. The desired portion of the copy can then be scanned separately. However, this requires extra steps on the part of the user, and also the final resulting image generated by the scanning device may be noticeably degraded from the original document as a result of using intermediate copies to arrive at the final result.

In addition to the problems of editing the scanned image to acquire only the desired portion of the overall scanned image, the process of scanning can be a relatively slow process at high resolutions. Thus, a user may desire to only scan one-fourth of the overall scanable area of a document. However, the scanning process is performed over the entire scanable area, thus requiring more scanning time than is required to scan only the portion of interest.

A couple of related problems pertain to the scanning process used in photocopiers and the like. The first problem arises when a document comprising a sheet of paper larger than the scanable area is placed on the platen of a photocopier or a scanner. Since the document is typically placed in a face-down position on the platen, the user normally will not know with certainty what area of the document will be scanned or copied. The user may have to make a number of copies (or perform a number of scans) of the document, repositioning the document each time, until the desired area is copied or scanned. The second problem pertains to making an enlargement of a portion of a document placed on the platen of a photocopier or a scanner. In this case the user typically is required to do some "guess-work" to estimate whether or not the portion of the document desired to be enlarged will in fact be the portion of the document scanned by the scanner. Again, the user may need to make a number of copies or scans until the desired enlargement is generated.

What is needed then is an optical scanner which achieves the benefits to be derived from similar prior art devices, but which avoids the shortcomings and detriments individually associated therewith.

SUMMARY OF THE INVENTION

The present invention provides methods and apparatus to allow a user to identify a selected scan window on the scanable surface (such as a glass platen) of an optical scanning device, such as a document scanner. The invention also includes methods and apparatus to allow a user to define the selected scan window. After the user defines the area of the scan window to be scanned (which can include the entire scanable area), the area is illuminated using a scan window illumination device. This allows the user to visually confirm that the defined scan window area will in fact capture the desired portion of the item being scanned. Further, once the scan window is defined, the scanner can scan only the defined scan window, thus reducing the time required to perform the scanning process, and also reducing the amount of data which must be processed as a result of performing the scan.

The present invention also allows a document placed on the platen of an imaging device which incorporates a scanner (such as a photocopier or the like) to be illuminated or back-lit so that a user can see what portion of the document lies within the scanable area of the platen, or a defined scan window on the platen.

In one embodiment the invention includes a scan window apparatus for defining and identifying a selected scan window within an overall scanable surface of a scanning device. The scan window apparatus can either be an attachment which can be added to an existing scanning device, or it can be an integral part of a scanning device. The scanable surface is defined by a first edge and a second edge, the second edge intersecting the first edge. The scan window apparatus includes a plurality of moveable position markers configured to move along the first and second edges of the scanable surface and thereby define the selected scan window. In the case where the scan window is rectangular (the common case), and the scan window is allowed to be located anywhere on the scanable surface, then two position markers are preferably provided on each edge of the scanable surface to thereby allow the four sides of the scan window to be oriented and sized anywhere on the scanable surface.

The scan window apparatus also has a scan window illumination device configured to illuminate the selected scan window. In one variation, wherein the scanable surface comprises a portion of an essentially transparent platen defined by a first side (an "upper" or "top" side) on which an object to be scanned can be placed, and an opposite second side (a "lower" or "bottom" side), the scan window illumination device is a light source positioned to direct light to the second side of the platen. This variation is preferably employed where the moveable position markers comprise intersecting (preferably orthogonal) bars or the like which pass over the scanable surface and define the scan window. In this way projected light which illuminates the scan window from the light source can aid in properly orienting the object to be scanned. The light source can be a stationary light source, such as a light bulb, or it can be the scanning light which is used to scan objects on the scanning device. Preferably, the light source is provided with a light diffuser to provide a somewhat even distribution of light across the entire scanable surface. Since the scanning light source is typically located quite close to the platen, when the scanning light source is used as the scan window illumination device, it is preferably provided with a mechanism to reposition the scanning light source away from the platen to provide better light distribution. The light source can also be used in conjunction with other scan window illuminating devices (described below) as a back-lighting source to back-light a translucent object (such as a sheet of paper) placed on the scanable surface.

When the scanable surface is defined by a transparent platen which is itself defined by a top and a bottom surface and by the first and second edges of the scanable surface, then the scan window illumination device can be a light source located in each of the position markers. In this situation the light sources are located proximate to the edges of the platen to allow light from the light sources to shine into the platen between the top and bottom surfaces thereof. Preferably the light sources are focused or coherent light sources, such as LEDs or lasers. In this way light beams can be directed into the platen across its length and across its width. The intersecting light beams thus identify the scan window. To improve visibility of the light in the platen the platen can be impregnated with small, light reflective particles oriented to reflect light from the light sources. However, the particles are also oriented to allow light to freely pass through the platen from the bottom surface to the top surface, and thus not noticeably affect the quality of the optical scan.

Generally, the selected scan window can be defined by a scan window perimeter, which will typically be four sides of a rectangular area. Thus, in a second variation of the first embodiment of the present invention the scan window illumination device can comprise a source of a focused beam of light which is configured to be directed to trace at least part of the scan window perimeter. Preferably, the entire perimeter of the scan window is continually traced with one or more focused beams of light to thus illuminate or trace the perimeter of the scan window. When the focused beams of light are moved faster than the flicker rate of the human eye, the perimeter can appear to be continuously illuminated.

The scan window apparatus can also include a plurality of position detectors configured to detect the positions of the plurality of position markers along the first and second edges of the scanable surface. The position detectors generate position signals in response to their positions along the edges of the scanable surface. The position signals can then be used to direct the focused beam of light in tracing the perimeter of the scan window. A number of different configurations can be used to allow the scan window illumination device to trace the scan window perimeter. In one arrangement the scan window apparatus is provided with an oscillating mirror. The focused beam of light is generated by a laser, and is directed to trace the scan window perimeter by the oscillating mirror. In another arrangement the scan window apparatus includes a rotating polygonal-sided mirror, and the focused beam of light (again, generated by a laser) is directed to trace the scan window perimeter by the rotating polygonal-sided mirror.

A second embodiment of the present invention provides for an optical scanning device having a platen defining a scanable surface, the scanable surface being defined by a first edge and a second edge which is essentially orthogonal to the first edge. The platen comprises an essentially transparent surface defined by an upper side and a lower side. The optical scanning device also includes a scanning light source located proximate the lower side of the platen and configured to optically scan an object placed proximate the upper side of the platen. A scan window definition device is provided to allow a user to define a selected scan window on the platen to be scanned by the scanning light source. The scan window definition device can be the moveable position indicators described above, or it can be a user interface in communication with an applications program allowing a user to enter coordinates for, or graphically designate, the selected scan window. The scanning device also comprises a scan window illumination device configured to illuminate the selected scan window. The scan window illumination device is preferably the device described above which is directed to trace the perimeter (or at least part of the perimeter) which defines the scan window. Preferably, the scan window definition device is used to direct the focused beam of light.

A third embodiment of the present invention provides for a method of identifying a selected scan window to be scanned as part of an overall scanable surface. The method includes defining the selected scan window, and then illuminating the scan window (prior to scanning the selected scan window) to thereby identify the selected scan window to the user. The scan window can be illuminated by shining a light towards the overall scanable surface. The scan window can also be illuminated by tracing at least a portion of the selected scan window perimeter on the overall scanable surface with a focused beam of light. Further, the scan window can be illuminated by both of these methods, to thus trace the perimeter of the scan window, and to back-light an object (such as a sheet of paper) placed on the scanable surface.

These and other aspects and embodiments of the present invention will now be described in detail with reference to the accompanying drawings, wherein:

DESCRIPTION OF THE DRAWINGS

FIG. 7 depicts a side elevation view of a document scanner which allows the scanning light source to be used to back-light an object placed on the platen of the scanner.

FIG. 8 depicts a side elevation detail of a deployable light diffuser which can be used in the apparatus of FIG. 7.

DETAILED DESCRIPTION OF THE INVENTION

Figure 1:
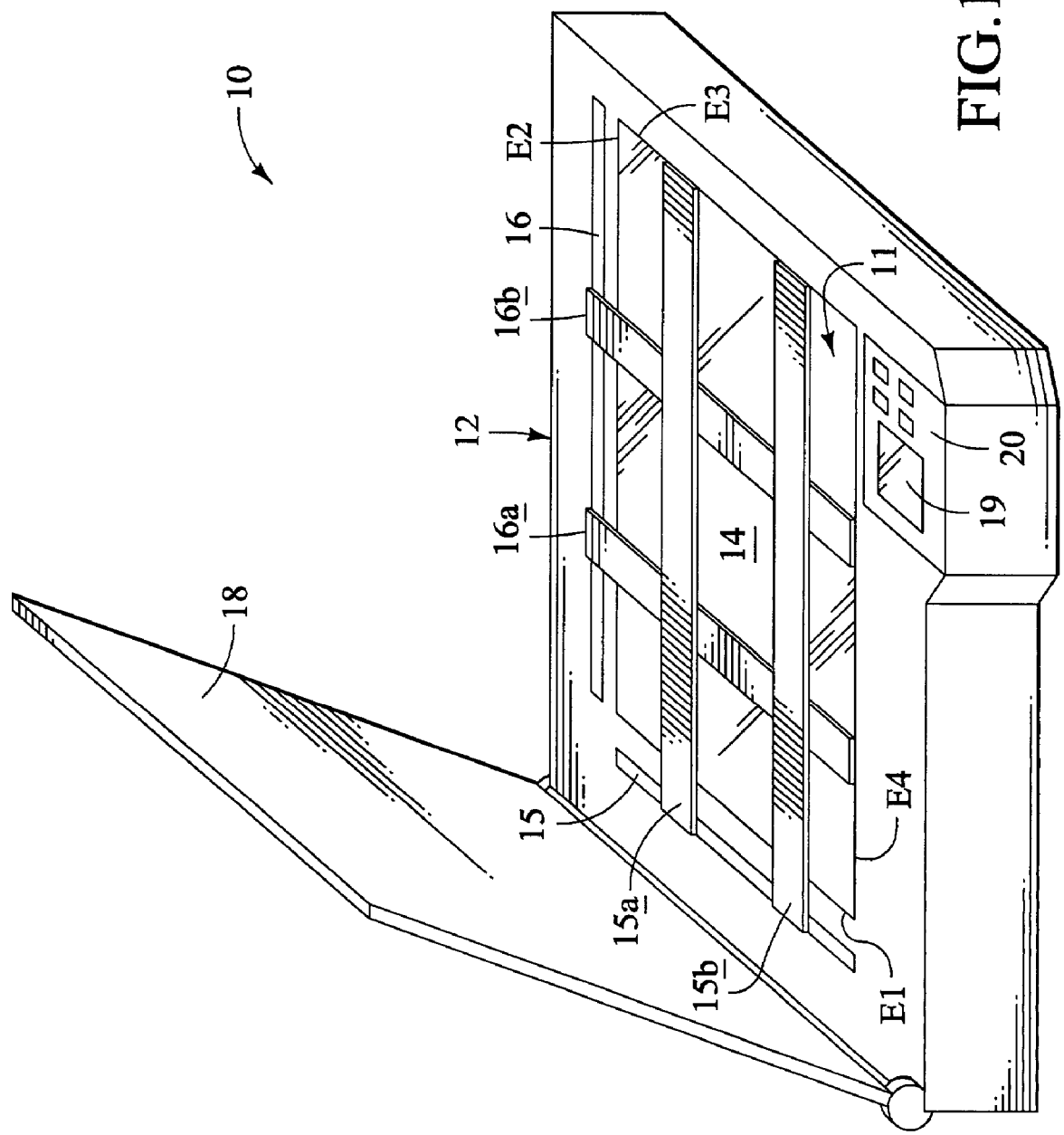
FIG. 1 depicts an oblique view of a document scanner having a first scan windowing device.

The present invention provides methods and apparatus to allow a scanable surface in an optical scanning device to be visually identified to the user. The overall scanable surface can be illuminated, or only a selected scan window defined on the scanable surface can be illuminated. The present invention also provides methods and apparatus to allow a user of an optical scanning device to define a selected scan window on the overall scanable surface. In this way a user of the scanning device can be provided with a visual identifier of the selected scan window to provide assurance that the selected scan window encompasses the desired area of an item to be scanned. Further, the user can further determine whether or not an area of a document to be scanned is within the scanable area of the scanner. When the scanner is provided with apparatus allowing the user to define a selected scan window, then the scan window defining apparatus can provide information to the scanner to direct the scanning device to scan only the predetermined selected area of the overall scanable surface.

By way of example, the optical scanning device can be a document scanner in a desktop peripheral device. One example of such a scanner is the Scanjet model 7450C available from Hewlett-Packard Company of Palo Alto, Calif. Typically the item to be scanned is a document, and the document is placed in a face-down position on a transparent glass platen (or "scanner bed"). A light bar or a scanned light beam (using a laser and a polygonal rotating mirror, for example) is then passed over the document, in the manner described above in the Background section. When the user desires to scan only a portion of a document which can be placed on the platen, then the present invention allows the user to define a selected scan window, which the user believes to correspond to the area on the document which the user desires to scan. The identification of the scan window preferably causes the scanning device to scan only the selected window, and not the other areas of the scanable surface (i.e., the platen). Once the user has placed the document on the platen and defined the scan window (not necessarily in that order), then the scan window can be illuminated by a scan window illumination device, in accordance with the present invention. The user will now be able to visually confirm that the scan window area to be scanned by the scanning device corresponds to the area of the document the user desires to scan. At this point the user can reposition the document to fit the desired area within the illuminated scan window. The user can also redefine the scan window if it does not encompass the area of the document which the user desires to scan. Once the illuminated scan window properly encompasses that portion of the document which the user desires to scan, the user can then begin the scanning process. After the scanning is complete, the user will be able to access an electronic image of the area scanned in the scan window (corresponding to the desired area of the document). If the scan window has been properly defined and the document properly positioned in the illuminated scan window, the user should not need to perform any post-scanning cropping of the image in order to obtain a scanned image of only the desired area of the document.

In another example, a user can have a document (such as a single page containing text and/or images) the size of which exceeds the size of the scanable area of the document scanner. The user can place the document on the upper surface of the platen (which defines the scanable area), and then actuate an illumination device which projects light to the lower surface of the platen. The illumination device back-lights the document, allowing the user to observe those portions of the document which lie within the scanable area on the platen. The user can then reposition the document so that the areas of the document the user desires to scan are positioned (as best as possible) within the scanable area.

It is understood that objects other than documents can be scanned by an optical scanner. However, in the following discussion we will use the example of scanning a document to facilitate understanding of the operation of the present invention. We will also use the expression "scanner" to mean an optical scanning device. It should be further understood that the present invention is not restricted to only apparatus which are configured to scan documents so that an image of the document can be reproduced in the form of an electronic file. Specifically, the invention is also applicable to any imaging device which includes an optical scanning device for optically scanning a document. For example, the invention can pertain to a photocopier which uses a an optical scanning device to scan a document and to generate an image of the document on an optical photoconductor. A marking agent (such as toner or ink) can then be used to transfer the scanned image of the document from the photoconductor to a sheet of media, such as paper or a transparency. The invention can also pertain to a facsimile machine which can scan a document and then transmit the scanned image to another location via a telecommunications network or the Internet. Similarly, the invention can pertain to a multi-purpose imaging apparatus which can be used to produce photocopies, send facsimiles, and scan documents for image processing.

Turning to FIG. 1, an optical scanning device 10 ("scanner") having a scan window apparatus in accordance with the present invention is depicted in an oblique view. In this instance the scan window apparatus comprises an integral part of the scanning device 10. The scanner 10 includes a main body 12 and lid 18 which is hinged to the body 12. The lid can be closed during the scanning process to improve the quality of the scanned image. The scanner 10 has a user interface having a display device 19 and user interface points 20 (such as buttons or keys). The scanner has a scanable surface which is defined by a platen 11, which is typically an essentially transparent, flat glass plate. Commonly, the platen is rectangular shaped, as depicted. The scanable surface is defined by a first edge E1, and a second edge E2, which is essentially orthogonal to the first edge E1. The edges E3 and E4 can further define the scanable surface. The scanner 10 further includes a scan window definition device to allow a user to define a selected scan window on the platen 11 to be scanned by a scanning light source (not shown). In the embodiment depicted in FIG. 1 the scan window definition device comprises a plurality of moveable position markers 15a, 15b, 16a, and 16b, which are moveably (slidably) supported in respective channels 15 and 16. Position markers 15a and 15b are configured to move along the first edge E1 of the scanable surface (as defined by the surface of the platen 11), and position markers 16a and 16b are configured to move along the second edge E2 of the scanable surface. In this way the position markers can define the selected scan window, identified here as scan window 14. The scanning device 10 further includes a scan window illumination device which can take various forms, and which is configured to illuminate the selected scan window 14. The scan window illumination device is not shown in FIG. 1, but is shown in other figures which will be discussed below.

Figure 2:
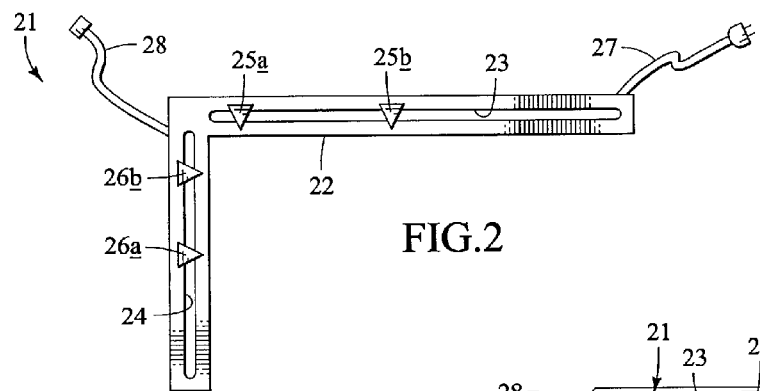
FIG. 2 depicts a plan view of a scan windowing attachment for use with an optical scanner.
Figure 3:
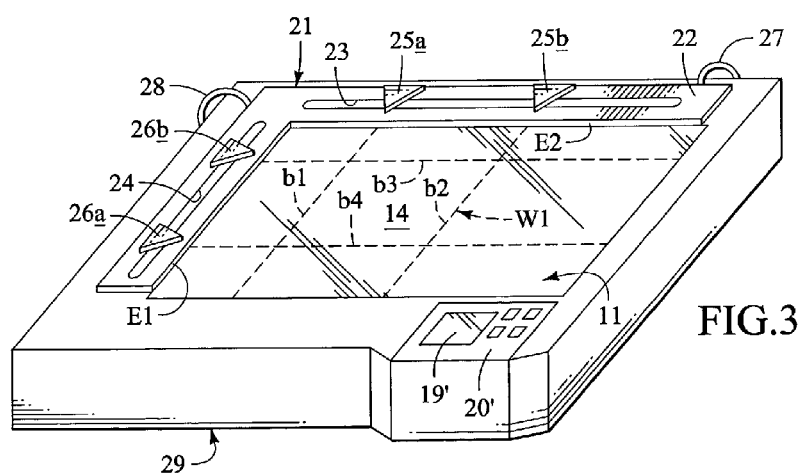
FIG. 3 depicts an oblique view of document scanner using the scan windowing attachment of FIG. 2.

Turning now to FIGS. 2 and 3, two variations on the scanner 10 of FIG. 1 are depicted. In the configuration depicted in FIG. 1 the position markers 15a and 15b are bars or members which are disposed across the entire length of the platen 11, and position markers 16a and 16b are bars or members which are disposed across the entire width of the platen 11. Further, the position markers 15a, 15b, 16a and 16b are integral with the scanning device 10. FIG. 2 depicts a plan view of a separate attachment 21 which includes position markers 25a, 25b, 26a and 26b. The position markers are configured to be moveable within the channels 23 and 24. A power cord 27 can be used to provide electrical power to the attachment 21, and a signal cable 28 can be used to provide position marker position signals to a processor or the like (not shown). The position marker attachment 21 can be used in conjunction with a prior art scanning device 29 which does not provide position markers as an integral part of the scanning device. FIG. 3 depicts an oblique view of a scanning device 29 which has the position marker attachment 21 applied to the bed of the scanning device. The position markers 25a and 25b are positioned along a first edge E2 of the platen 11, and position markers 26a and 26b are positioned along a second edge E1 of the platen. The position markers can thus define a scan window 14 (W1) on the overall scanable area of the platen 11. The window 14 (W1) is bounded by window borders b1, b2, b3 and b4. The position markers can thus be considered as a scan window definition device. The scanning device 29 is further provided with a user interface having a display device 19 and user interface points 20 (such as buttons or keys). As with the scanner 10 of FIG. 1, the scanning device 29 of FIG. 3 further includes a scan window illumination device which can take various forms, and which is configured to illuminate the selected scan window 14. The scan window illumination device is not shown in FIG. 3, but is shown in other figures which will be discussed below.

Figure 4:
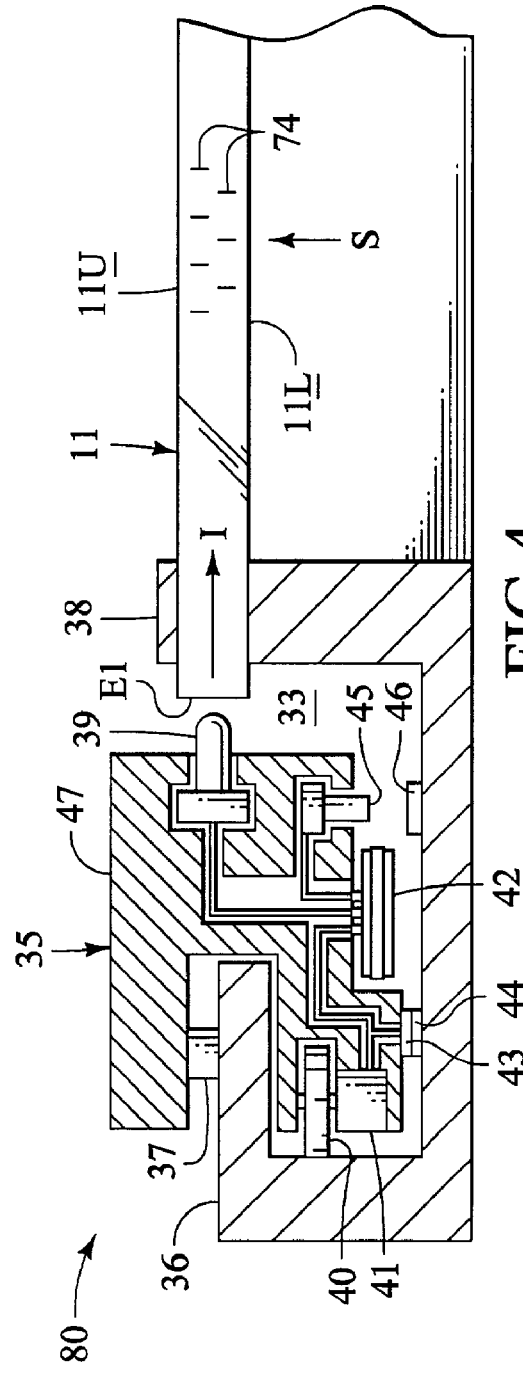
FIG. 4 depicts a cross sectional side view of a document scanner having a scan windowing device configured to be manually positioned.

Turning now to FIG. 4, a side elevation partial sectional view depicts scanning device 80 which includes a scanning device body member 36 and a position marker 35 which is positioned along a first edge E1 of a platen 11. The position marker 35 can be for example one of the position markers 26a or 26b of FIG. 3. The position marker 35 can be held in a relatively fixed position along the edge E1 by a spring 37 or the like. The platen 11 is secured to the body 36 of the scanning device 80 by a securing member 38. The platen 11 is defined by a first side 11U, and an opposite second side 11L. The first side 11U of the platen 11 may also be referred to herein as the "upper" or "top" side of the platen, while the second side 11L may also be referred to as the "lower" or "bottom" side of the platen. The top and bottom sides of the platen can also be described as top and bottom surfaces of the platen 11. The first edge E1 of the scanable surface defined by the platen 11 is defined between the top 11U and bottom 11L of the platen. The position marker 35 includes a body member 47, which is moveably positioned in a channel 33 such that the position marker 35 can move in a direction into and out of the plane of the sheet on which FIG. 4 is drawn. The scanning device 80 can include additional position markers, as suggested by FIGS. 1 and 3, but only one such marker is depicted in FIG. 4 for the sake of simplicity.

The position marker 35 (and any of the other position markers identified herein) can be provided with a position detector. The position detector is any device which allows the position of a position marker along the edge of the scanable surface to be identified or detected. In response to identifying or detecting the position of the position marker, the position detector generates an electronic signal (indicative of the position of the position marker) which can be used by a processor, such as a microprocessor. Thus, for example, when each of the position markers 25a, 25b, 26a and 26b of FIG. 3 are provided with a position detector, the precise location of the scan window 14 on the scanable surface 11 can be uniquely defined and identified. The position detector can take one of several forms. In FIG. 4 three different forms of position detectors are depicted, however it is understood that the position marker 35 does not need all three types of position detectors, and that only one position detector is required to achieve the objectives associated with the position detector.

The first position detector depicted in FIG. 4 is a rotary encoder. The rotary encoder comprises an encoder wheel 40 which contacts the body 36 of the scanner 80. As the position marker moves in the channel 33, the encoder wheel 40 is rotated, and a signal is generated by the rotary encoder signal generator 41. The rotary encoder signal generator 41 can be configured to generate pulses of one signal (a positive signal, for example) when the encoder wheel is rotated in a first direction (corresponding to movement of the position marker 35 in a first direction), and to generate pulses of another signal (a negative signal, for example) when the encoder wheel is rotated in a second direction (corresponding to movement of the position marker 35 in a second direction). By assigning a value of "zero" to the encoder signal when the position marker is located in an initial position along the edge E1 of the platen 11, as the position marker is moved along the edge E1, the encoder signal generator 41 generates a number of pulses corresponding to the distance along the edge E1 in which the position marker has moved. Each pulse generated by the encoder signal generator 41 can correspond to a known distance along the edge E1, so that a processor receiving the pulse signals can calculate the total distance the position marker 35 has moved along the edge E1. The position marker 35 can be in communication with a processor (not shown) by a flexible ribbon bus 42, allowing the encoder generator 41 to transmit signals to the processor.

The position detector can also comprise an electrical contact 43 supported on the position marker 35 and in contact with an electrical resistance strip 44 which is positioned within the channel 33 of the scanner 80. The resistance strip 44 can provide a known electrical resistance per unit of length of the resistance strip. The electrical contact 43 can measure the value of an electric current in the resistance strip 44 (which will be reduced as a function of the distance along the resistance strip by virtue of the designed-in resistance of the resistance strip). This measured current can be provided in the form of a position signal to a processor. Thus, the further along the resistance strip 44 the electrical contact 43 is moved, the less will be the current in the resistance strip, as measured by the current in the electrical contact. Since the resistance (i.e., electrical current) at a starting position along the edge E1 can be measured, the distance of the position marker along the channel 33 (and hence the edge E1) can be calculated by measuring current in resistance strip 44, as detected by the electrical contact 43.

A third position detector depicted in FIG. 4 comprises an optical position detector. The optical position detector comprises an optical sensor 45 which is supported by the position marker 35, and a optical position indicator 46 which is mounted in the channel 33 of the scanner 80. The optical position indicator 46 can comprises a strip of alternating light and dark stripes running in a direction perpendicular to the edge E1. The optical sensor 45 can be provided with a light source and a light detector, such that as light from the light source alternately impinges on the light and dark stripes of the optical position indicator 46, the light detector in the optical sensor 45 will respectively detect or not detect reflected light from the light and dark stripes. The light detector in the optical sensor 45 thus can generate signals as alternating light and dark stripes on the optical position indicator 46 are detected. The number of signals generated by the light detector in the optical sensor 45 are thus indicative of the distance along the edge E1 that the position marker 35 has moved.

Other known position detectors can also be used. For example, the position detector can use an electromagnetic field detector to measure the electromagnetic field generate by an electric current in an electrical resistance strip, similar to the electrical contact version of items 43 and 44 described above. This variation, which relies on detection of an electromagnetic field and therefore does not require physical contract between the components 43 and 44, reduces frictional wear on the components used to detect the signal strength. In another alternative configuration the optical position indicator 46 can be encoded with optically detectable position information which can uniquely identify discrete positions along the position indicator 46. In this manner the optical sensor 45 can detect a signal unique to any discrete position along the position indicator 46, and the step of calculating the position as a function of the number of pulses detected by the position indicator 46 can be eliminated. (However, a processor will need to be provided with an algorithm allowing the unique signal to be translated into position information indicating the position of the position marker 35 along the edge E1.) It will be appreciated by one skilled in the art that other position detectors not specifically described herein can also be used to equal effect. Thus, any device which can be used to determine the position of a position marker along an edge of the platen, and can generate a signal indicative of the position of the position marker, can be used as a position detector.

The position marker 35 can also be provided with a light source 39 located in the position marker 35. The light source 39 is located proximate to the edge E1 of the platen 11 to allow light "I" from the light source to be projected into the platen 11 between the top surface 11U and the bottom surface 11L of the platen. When a light source (such as light source 39) is provided for each position marker (such as position markers 25a, 25b, 26a and 26b of FIG. 3), the collective light sources will illuminate the area bounded by the intersecting projections of the position markers, such as scan window 14 of FIG. 3. In this manner, the light source 39 acts as a scan window illumination device, in accordance with the present invention. Preferably, the light source 39 is a focused light source, such as a light emitting diode (LED), or a laser. (Although a laser is technically a coherent light source, it can be considered as a "focused" light source by virtue of its narrow projection of a light beam from the laser.)

In order to improve the visibility to the human eye of the focused light beam "I" as the beam is projected into the platen 11, the platen can be impregnated with light reflective particles 74 oriented to reflect light from the light source 39. Preferably, the reflective particles are sized and positioned to allow light "S" from the scanning light source (not shown) to freely pass through the platen 11 from the bottom surface 11L to the top surface 11U, so that the particles 74 do not significantly degrade the quality of a scanned image which is produced as a result of scanning through the platen 11 with the scanning light source. For example, the particles 74 can be microscopic planar particles of silicon which are disposed within the platen 11, and which are oriented such that their planes are perpendicular to the focused light source "I", but parallel to the scanning light "S".

Figure 5:
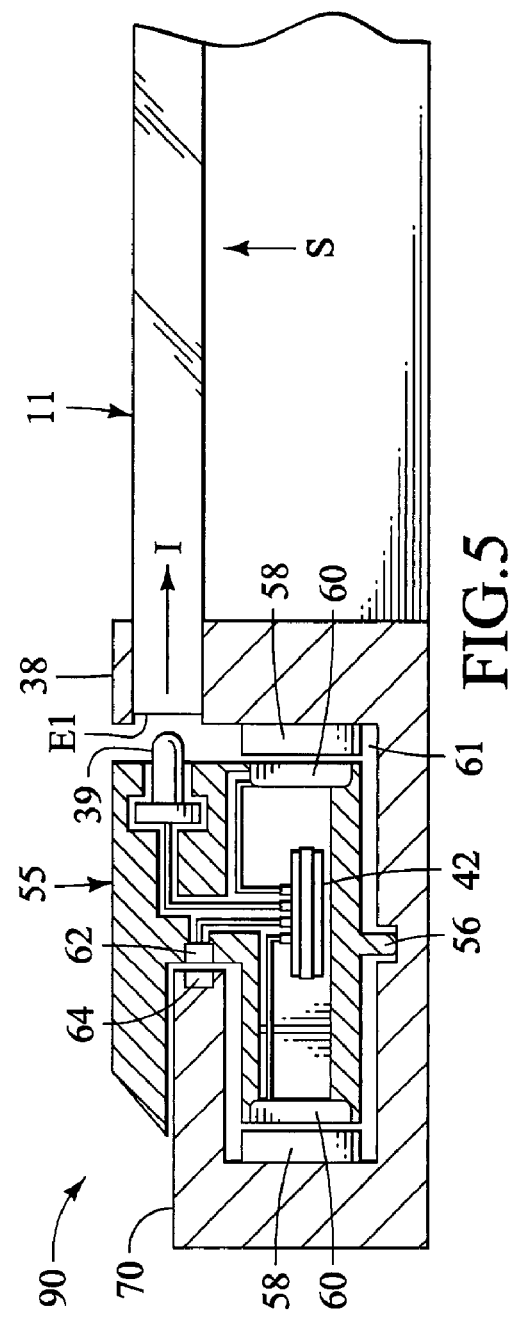
FIG. 5 depicts a cross sectional side view of a document scanner having a scan windowing device configured to be automatically positioned.

Turning now to FIG. 5, a variation of the scanner 80 of FIG. 4 is depicted in a side elevation, partial sectional view. The scanning device 90 of FIG. 5 comprises a position marker 55 which is configured to be moved along a channel 61 which is formed in the frame 70 of the scanner 90. Unlike the position marker 35 of FIG. 4 which is moved manually, the position marker 55 of FIG. 5 can be the moving body portion of a linear motor. Thus, the position marker 55 can be moved to a selected position along the edge E1 of the platen 11 upon receipt of a signal, such as from a user interface (described further below). The position marker body 55 rides on a bearing surface 56 which is set into a groove in the scanner frame 70. A pair of electromagnetic impeller strips 58 supported in the channel 61 act on fixed magnets 60 in the position marker to move the position marker to a selected position. The position marker also can include a position detector 62 and 64 (similar to the position detector 45 and 46, described above with respect to FIG. 4) which can be used to verify the position of the position marker 55 along the edge E1. The position marker 55 can include the source of focused light 39 (shown here as an LED), which can be used to illuminate one edge of the selected scan window, in the manner described above with respect to FIG. 4.

Figure 6:
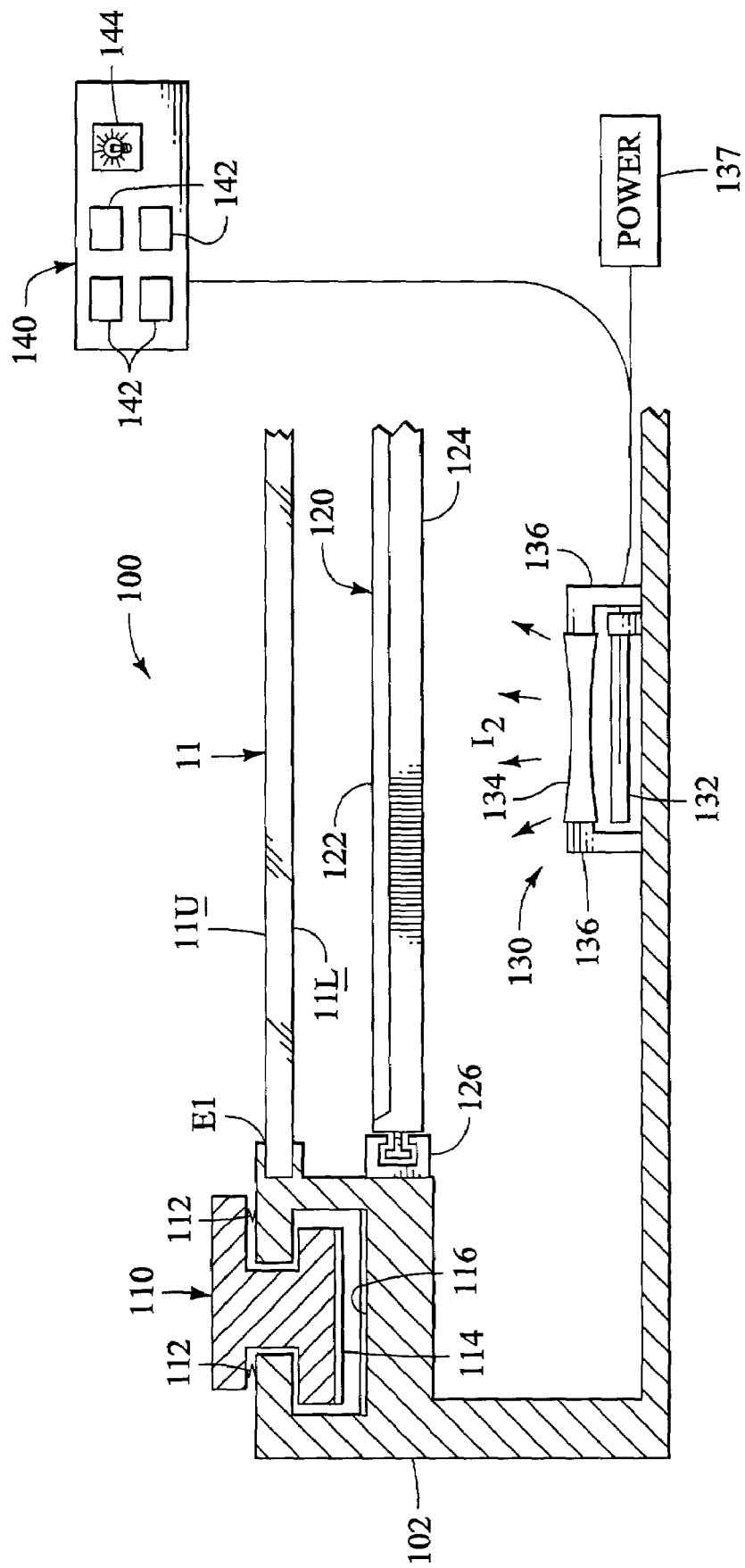
FIG. 6 depicts a side elevation sectional view of a document scanner having a first illumination device to back-light an object placed on the platen of the scanner.

Moving now to FIG. 6, a partial side elevation sectional view of a scanner 100 in accordance with the present invention is depicted. The scanner 100 includes a position marker 110, which is supported on springs 112 and includes a position detector 114 and 116, which can act similar to the position detector 45 and 46 of FIG. 4 to facilitate in defining the selected scan window. The position marker 110 of FIG. 6 can also include the other components described with respect to the position markers 35 and 55 of respective FIGS. 4 and 5. The scanner 100 can include additional position markers, as suggested by FIGS. 1 and 3, but only one such marker is depicted in FIG. 6 for the sake of simplicity. The scanner 100 of FIG. 6 has a scanner body 102 and a platen 11 having a first side 11U, and a second side 11L. The scanner 100 further includes a movable scanning light 120 which comprises a support body 124 and a scanning light source 122. The scanning light 120 is supported on rails 126 (only one of which is shown) proximate to the second side 11L of the platen. The rails 126 allow the scanning light 120 to move along the edge E1 of the platen (i.e., in a direction into and out of the plane of the sheet on which FIG. 6 is drawn) and thereby optically scan an object placed on the first side 11U of the platen.

The scanning device 100 is also provided with a scan window illumination device 130. The scan window illumination device 130 includes a light source 132 which is mounted in the scanner body 102 and is directed towards the second side 11L of the platen 11. The scan window illumination device 130 allows a document placed on the upper side 11U of the platen to be illuminated, or back-lighted, by the illumination device 130. More specifically, when a document is placed in a selected scan window and the scan window illumination device 130 is actuated, the selected scan window (as well as adjacent areas) will be illuminated by light "$I_2$", thus allowing a user to verify that the desired portion of the document has indeed been positioned within the selected scan window. The light source 132 can be an incandescent light bulb, and can be connected to a power source 137. The activation of the light source 132 can be performed from a user input console 140 which can include switches 142 for performing scanning functions, as well as an "illuminate" switch 144 which can actuate the window illuminating light source 132. In order to provide a more even illumination of the scanable surface of the platen 11 by the light source 132, the scan window illumination device 130 can be provided with a light diffuser 134. The light diffuser is depicted here as a double concave lens supported by brackets 136. The light diffuser can also be a non-lens type diffuser. Although the scan window illumination device 130 is depicted as being stationary, it can also be mounted on a moveable guide or guides (not shown). In this manner the scan window illumination device 130 can be positioned (using positioning motors and information from the position detectors 114) proximate to (or beneath) the selected scan window, thus providing greater illumination than might be provided when the scan window is distant from the light source 132.

Turning to FIG. 7, a variation of the scanner 100 of FIG. 6 is depicted. The scanning device 200 of FIG. 7 is depicted in a partial side elevation sectional view. The scanner 200 includes a position marker 210, which includes a position detector 214 and 216, which can act similar to the position detector 45 and 46 of FIG. 4 to facilitate in defining and identifying the selected scan window. The position marker 210 of FIG. 7 can also include the other components described with respect to the position markers 35 and 55 of respective FIGS. 4 and 5. The scanner 200 can include additional position markers, as suggested by FIGS. 1 and 3, but only one such marker is depicted in FIG. 7 for the sake of simplicity. The scanner 200 of FIG. 7 has a scanner body 202 and a platen 11 having a first side 11U, and a second side 11L. The scanner 200 further includes a movable scanning light assembly 220 which is detailed in FIG. 8 and will be discussed further below. The scanning light assembly 220 is supported on rails 222 (only one of which is shown) proximate to the second side 11L of the platen. The rails 222 allow the scanning light assembly 220 to move along the edge E2 of the platen (i.e., in a left-right direction as depicted in the figure) and thereby optically scan an object placed on the first side 11U of the platen.

In the scanning device 200 of FIG. 7 the scanning light assembly can act as the scan window illumination device. That is, the light source used to scan an object on the platen can also be used to illuminate the selected scan window prior to performing the scanning operation. The combination scanning light assembly/scan window illumination device 220 can be in electrical signal communication with a user console 240 which includes switches 242 to perform the scanning operation, as well as an "illuminate" switch 244 which can be actuated to cause the scanning light assembly 220 to operate as the scan window illumination device. For example, by actuating the "illuminate" switch 244 the scanning light assembly 220 can be caused to move to the center of the scanable area of the platen 11 and then to illuminate the lower side 11L of the platen 11 using the scanning light source 226 (FIG. 8). Alternately, by using position information from the position detector 214, 216 the scanning light assembly 220 can be caused to move to a position beneath the selected scan window on the platen 11.

A detail of the combination scanning light assembly/scan window illumination device 220 is depicted in FIG. 8. The scanning light assembly comprises a support body 224 and a scanning light source 226. The scanning light assembly 220 can also be provided with a deployable diffuser 228 which can be mounted on a support arm 232. The diffuser 228 can be located in the position shown when the scanning light source 226 is used to illuminate the scan window to more evenly distribute the illumination "$I_3$" as shown. When the scanning light source is used to scan a document or the like, then the diffuser 228 can be moved in direction "B" by a motor 234 (such as a rotary positioner motor). A guide track 230 with a guide slot 236 can be used to support the diffuser 228 in both its deployed position (as shown) and it's undeployed position. The deployment of the diffuser 228 can be actuated by pressing the "illuminate" button 244 on the user console 240 of FIG. 7.

It should be understood that the scan window illumination devices described for FIGS. 6 and 7 (which generally operate by illuminating the bottom side of the scanable surface) can be used in combination with the scan window illumination device described in FIG. 4 (which directs a focused beam of light into the platen). In this way the perimeter of the scan window can be identified by the focused beams of light projected into the platen (from light sources 39), and the underside illumination device (130 or 220) can essentially back-light a document placed over the scan window.

It should also be understood that the scan window illumination devices described for FIGS. 6 and 7 (which generally operate by illuminating the bottom side of the scanable surface) do not need to be used in conjunction with window identification devices, such as the position markers described above. In this way a document placed on the platen of an imaging device which includes a scanner (such as a photocopier) can be backlit to facilitate a user in visually identifying those portions of the document which are within the scanable area of the platen. Accordingly, when the scan window illumination devices 130 of FIG. 6 and 220 of FIG. 7 are used to illuminate the scanable area of a platen without regard to a selected scan window comprising an area smaller than the overall scanable area, then the scan window illumination devices can be termed generically as "illumination devices".

As described previously, the selected scan window can be defined by a perimeter, which will typically be four sides of a rectangular area. The scan window illumination device described in FIGS. 4 and 5 (which projects light from the light source 39 into the platen 11) can basically illuminate the perimeters of the scan window, as for example scan window 14 in FIG. 3, wherein the dashed lines on the platen 11 can represent light from light sources 39 (FIG. 4). However, in another embodiment of the present invention the scan window illumination device can comprise a focused light source configured to generate a focused beam of light which can then be directed to trace at least part of the scan window perimeter on the platen. That is, the focused light source is used to trace the scan window perimeter, rather than being projected along the perimeter (as in FIG. 3). We will now describe how the scan window perimeter can be traced.

Figure 9:
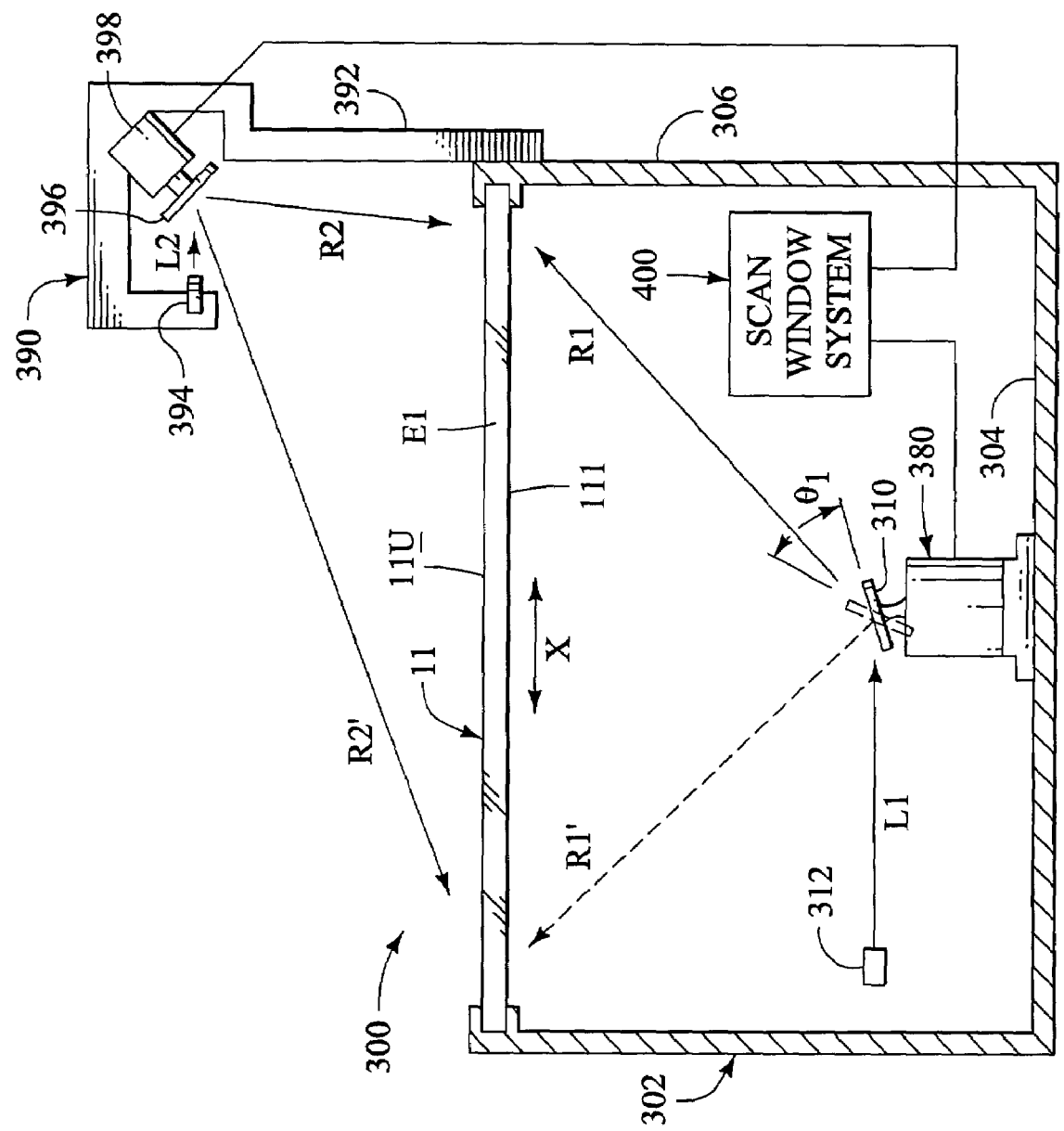
FIG. 9 depicts a schematic diagram of a side elevation view of a document scanner having a focused light source configured to trace a scan window on a platen of the scanner.

Turning to FIG. 9, a side elevation sectional view of a scanner 300 is depicted in sectional view. The optical scanning device 300 comprises a scanner body 302 and a platen 11 which is supported by the scanner body. The platen defines the scanable surface, and has an upper side 11U and a lower side 11L. The scanner 300 comprises one embodiment of a scan window illumination device 380 for tracing at least a portion of the scan window perimeter onto the platen 11. The scan window illumination device is depicted as being attached to the base 304 of the scanner within the body 302 of the scanner 300 such that a light beam R1 from a focused (or coherent) light source 312 (preferably, a laser) can be projected to the lower side 11L of the platen 11. Alternately, the scan window illumination device can be mounted outside of the scanning device 300, as indicated by the scan window illumination device 390 which is supported from the side of the scanner body 302 by bracket 392. In this latter configuration a light beam R2 from a focused (or coherent) light source 394 can be projected to the upper side 11U of the platen 11.

With respect to the scan window illumination device 380, an oscillating mirror 310 is used to reflect the light beam L1 from the focused light source 312. By oscillating the mirror 310 through the scanning angle Θ the light beam is moved from the first reflected position R1 to the second position R1'. Accordingly, by adjusting the size of the angle Θ, and the initial position of the mirror 310, a line of any length, at any position, can be scanned along the platen 11 in the direction of the edge E1. An electronic scan window system 400 (described more fully below) can be used to control the angle Θ and the initial position of the oscillating mirror 310. With respect to the scan window illumination device 390, an oscillating mirror 396 is used to reflect the light beam L2 from the focused light source 394. By oscillating the mirror 396 through a scanning angle (which may be the same as or different from the angle Θ the position the light beam L2 is moved from the first reflected position R2 to the second position R2'. Accordingly, by adjusting the size of the oscillation angle of the mirror 396, and by adjusting the initial position of the mirror 396 as it begins its oscillations, a line of any length, at any position, can be scanned along the upper side 11U of the platen 11 in the direction of the edge E1. The electronic scan window system 400 (described more fully below) can also be used to control the oscillation angle and the initial position of the oscillating mirror 396.

Figure 10:
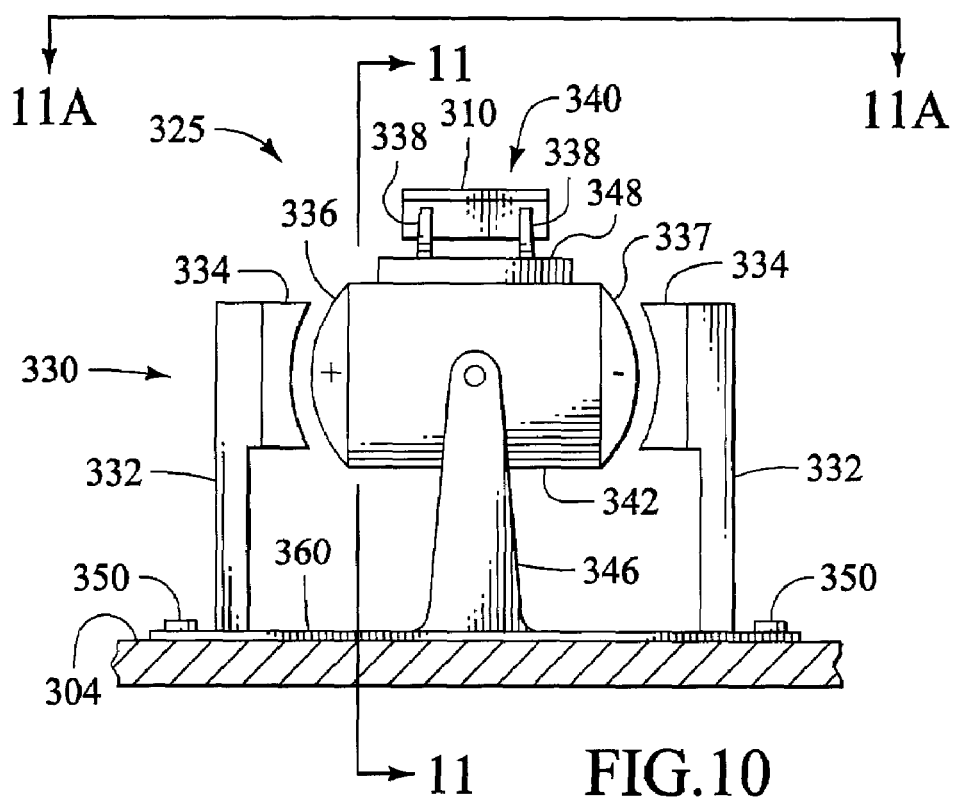
FIG. 10 depicts a front elevation view of a first scan window illumination device which can be used in the document scanner of FIG. 9.
Figure 11:
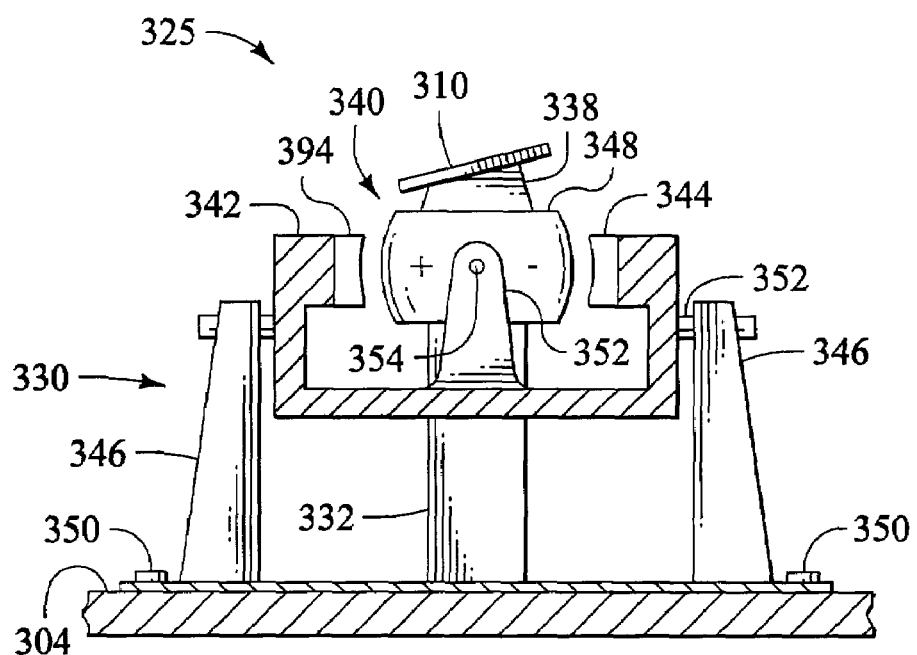
FIG. 11 depicts a sectional side elevation view of the scan window illumination device of FIG. 10.
Figure 11A:
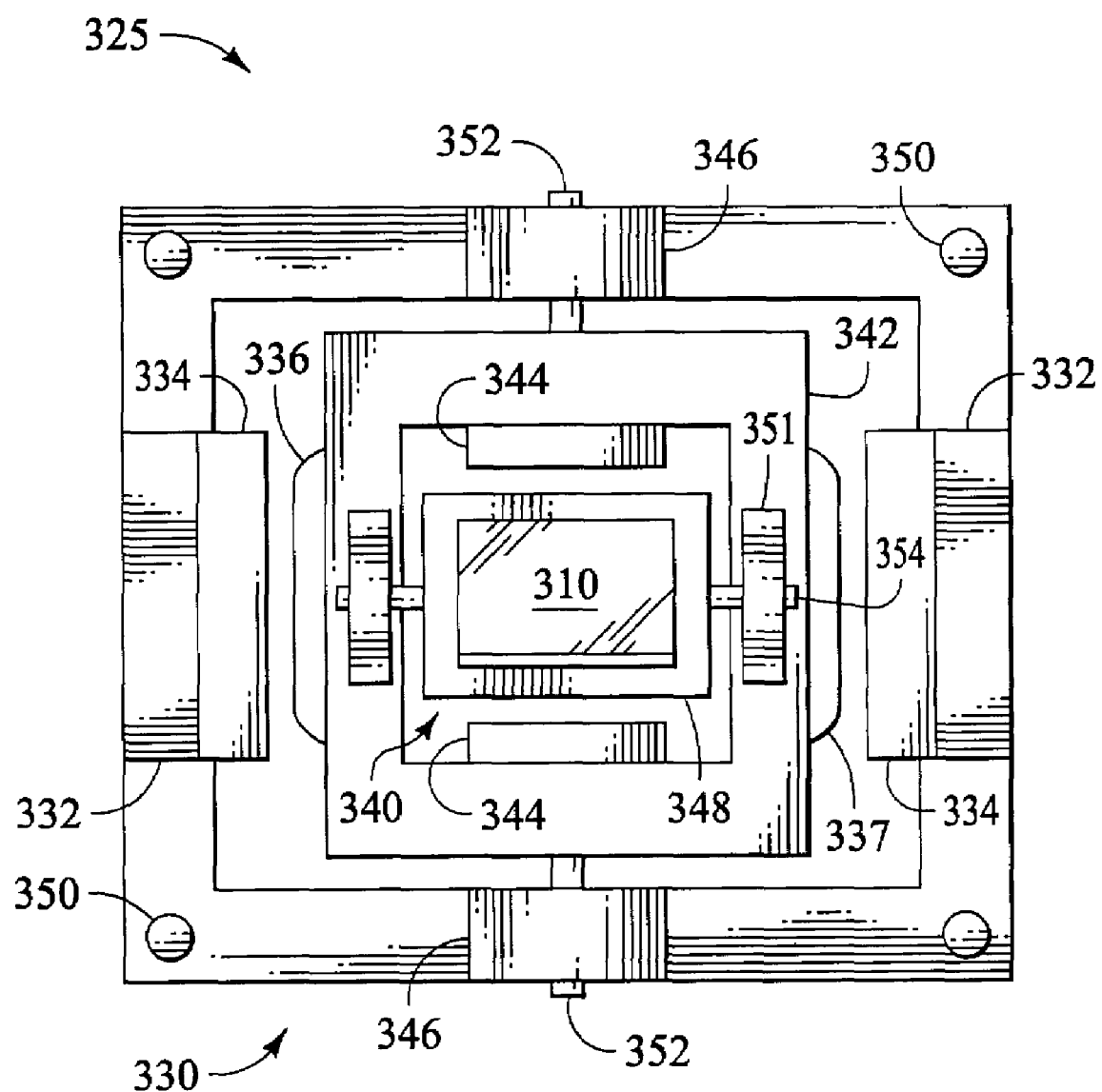
FIG. 11A depicts a top view of the scan window illumination device of FIGS. 10 and 11.

Preferably, a single oscillating mirror is used to scan all four sides of the perimeter of the selected scan window. An apparatus which can be used to this end is depicted in FIGS. 10, 11 and 11A. FIG. 10 depicts a front elevation view of a scan window illumination device 325 which can be used in place of the scan window illumination device 380 of FIG. 9. FIG. 11 depicts of a side elevation view of the scan window illumination device 325 shown in FIG. 10, and FIG. 11A depicts a top view of the scan window illumination device 325. Essentially, the scan window illumination device 325 uses the concept of a beam scanning galvanometer for oscillating a mirror. A beam scanning galvanometer is described for example in U.S. Pat. No. 5,280,377, issued Jan. 18, 1994 to Chandler et al., and incorporated herein by reference in its entirety. A beam scanning galvanometer allows high frequency oscillation of a mirror, and therefore can be used to trace the scan window perimeter at a frequency faster than the flicker rate of the human eye. This gives the traced perimeter the appearance of being continuously illuminated at all points around the scan window perimeter.

With respect to FIG. 10, the scan window illumination device 325 uses a first beam scanning galvanometer 330 to oscillate the mirror in a first plane (i.e., clockwise and counter clockwise in the plane of depiction). The scan window illumination device 325 also uses a second beam scanning galvanometer 340 to oscillate the mirror in a second plane which is orthogonal to the first plane of oscillation. (This is made clear by reference to FIG. 11A, which depicts the two scanning galvanometers 330 and 340 and shows how they are gimbal mounted along orthogonal axes.) More accurately, the first beam scanning galvanometer 330 oscillates the second beam scanning galvanometer 340, which supports the mirror 310. When both the first and second beam scanning galvanometers are oscillated in alternating sequence, then a beam of light reflected by the mirror 310 can be caused to move rapidly in a rectangular pattern, thus tracing a rectangular image of a selected scan window onto the platen (11 of FIG. 9).

As depicted in FIG. 10, the first beam scanning galvanometer 330 comprises an oscillating permanent magnet support body 342 which supports first permanent magnets 336 and 337. The magnet support body 342 is gimbal mounted to supports 346 by bearings (shown as pins 352). The supports 346 are attached to a frame 360, which is attached to the interior bottom 304 of the scanning device (such as 300 of FIG. 9). Fasteners 350 can be used to secure the scan window illumination device 325 to the scanner bottom 304. The frame 360 also supports pedestals 332, to which a first set of driving coils 334 are attached. The driving coils 334 are connected to an electrical source (not shown) allowing the polarity in the coils to be periodically reversed, thus causing the magnet support body 342 to oscillate about the pins 352 in accordance with the period of reversal of polarity of the current in the driving coils 334. As shown in FIG. 11, the magnet support body 342 of the first beam scanning galvanometer 330 acts as the support for the second beam scanning galvanometer 340. The magnet support body 342 also supports a second oscillating permanent magnet 348 on support posts 351 using bearings (such as pins 354). The magnet support body 342 also supports a second set of driving coils 344. The mirror 310 is supported on the second oscillating permanent magnet 348 by mirror supports 338. The second driving coils 344 are connected to an electrical source (not shown) allowing the polarity in the coils to be periodically reversed, thus causing the second permanent magnet 348 to oscillate about pins 354 in accordance with the period of reversal of polarity of the current in the driving coils 344.

Preferably the components of the oscillating mirror scan window illumination device 325 which oscillate during operation of the device are manufactured with small inertial masses, allowing them to be moved and stopped very quickly. Since the mirror 310 only needs to be large enough to reflect the bulk of the light beam L1 (FIG. 9), the mirror can be relatively small, and consequently so can the other components in the device 325. The magnet support body 342 can be made of a light weight substance, such as polycarbonate. Also, the second permanent magnet 348 can have a lightweight central body, for example a polycarbonate body, with metal (or "plastic") magnets mounted on the outer ends of the body (i.e., towards the positions indicated in FIG. 11 as "+" and "−"). Also, by designing the width and length of the first magnet body 342 to be as narrow as possible, the inertia of the magnet body 342 will be reduced over a wider design.

In operation, the polarity in the first driving coils 334 can be set to a first polarity to cause the magnet support body 342 to move in a clockwise direction (as viewed in FIG. 10). The polarity can then be removed from the first coils 334, allowing the magnet support body 342 to stop rotation. The polarity in the second coils 344 can then be set to a first polarity to cause the second magnet 348 (FIG. 11) to move in a clockwise direction (as viewed in FIG. 11). The polarity can then be removed from the second coils 344, allowing the second magnet 348 to stop rotation. Then the polarity in the first driving coils 334 can be set to a second polarity to cause the magnet support body 342 to move in a counter-clockwise direction (as viewed in FIG. 10). The polarity can then be removed from the first coils 334, allowing the magnet support body 342 to stop rotation. Finally, the polarity in the second coils 344 can be set to a second polarity to cause the second magnet 348 to move in a counter-clockwise direction (as viewed in FIG. 11). The polarity can then be removed from the second coils 344, allowing the second magnet 348 to stop rotation. In this way all four sides of the perimeter of a selected scan window can be traced using a single light source (312 of FIG. 9).

In order to determine the duration of time during which the different polarities are applied to the two sets of coils 334 and 344, position information regarding the positions of the perimeters of the scan window can be obtained from position detectors (as described above with respect to FIG. 4). This position information can be used to define the length of the sides of the scan window perimeter, and thus the duration of the period during which a polarity is applied to each of the two sets of coils 334 and 344. Further, the position information can be used to identify the starting point for the tracing routine described above. The mirror 310 can thus be initially positioned using the coils 334 and 344 before the tracing routine is initiated.

Figure 12:
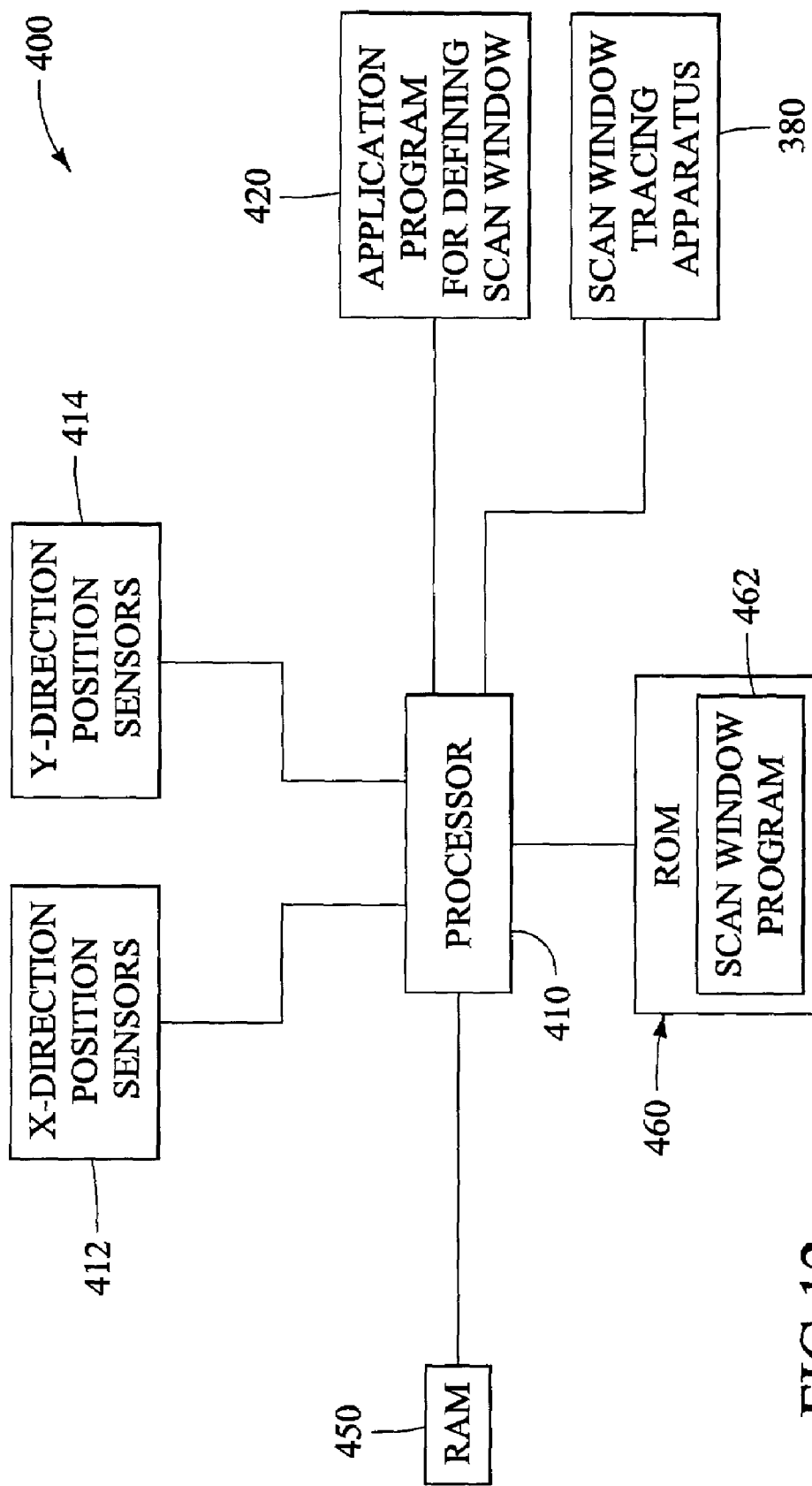
FIG. 12 depicts a schematic diagram of the various system components which can be used to implement a scan window illumination device.

Preferably, a microprocessor is used to process the position information obtained from position detectors in order to direct or "steer" the reflected light beam using the mirror 310. FIG. 12 depicts a schematic diagram of a scan window system 400 (as shown in FIG. 9) which can be used to this effect. The scan window system 400 includes a processor 410, such as a microprocessor, a computer readable-writeable memory device, such as the random access memory device (RAM) 450, and a computer-readable memory device, such as read-only memory device (ROM) 460. A set of computer executable instructions in the form of a scan window program 462 can be stored in the ROM device 460.

The processor 410 can receive position marker information from x- and y- direction position detectors (or sensors) 412 and 414, and can store the position information in the RAM device 450. The processor 410 can execute the scan window program 462 to read the position information from the RAM device 450 and to calculate the initial position for the oscillating mirror (310 of FIGS. 9-11), as well as the duration and polarities of the of the electrical currents to be provided to the driving coils 334 and 344 (FIGS. 10 and 11). The results of the calculations can be stored in the RAM device 450, and can then be read by the processor 410 and used by the scan window program 462 to control the oscillations of the mirror 310 and thereby direct the reflected laser beam (R1 of FIG. 9, for example) to trace the scan window perimeter onto the platen 11.

Figure 16:
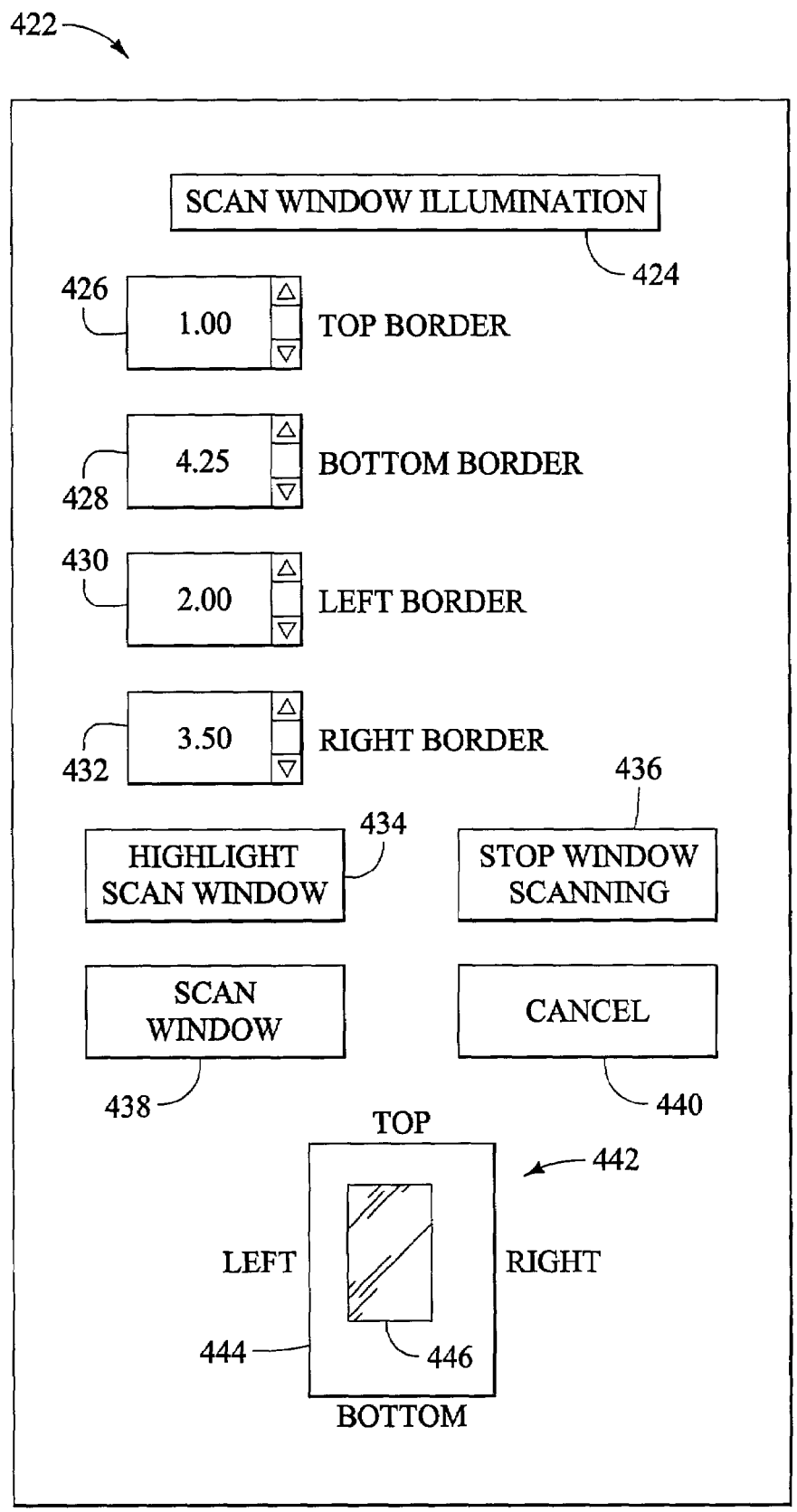
FIG. 16 depicts a user interface which can be displayed on a screen to allow a user to use the scan window illumination device of FIGS. 13 and 14.

In one variation, rather than use position markers (such as 25a, 25b, 26a and 26b of FIG. 3) and position detectors (such as 45 and 46 of FIG. 4) to identify the locations of the perimeter of the scan window, an applications program (as 420 of FIG. 12) can be used to define the size and location of the selected scan window on the scanable surface. The applications program 420 can be supported on, and executed by, a personal computer or the like (not shown) which is in signal communication with the scanning device. The applications program 420 can also be stored and executed internally within a scanning device (such as scanner 300 of FIG. 9) through a user interface console, such as 19' and 20' of FIG. 3. When the applications program is supported on a personal computer then a relatively detailed graphical user interface can be provided to allow a user to define the scan window. One example of such an interface is depicted in FIG. 16, which shows a user interface 422 which can be displayed on the screen of a computer monitor. The user interface 422 includes a title box 424 ("SCAN WINDOW ILLUMINATION") to identify the function of the user interface 422 to the user. The user interface can include numerical text input boxes 426, 428, 430 and 432 which allow the user to define the respective top, bottom left and right borders of the scan window. A graphical display 444 can be provided to portray the size and location of the selected scan window 446 as it appears on the overall scanable surface, and as defined by the values entered into the input boxes 426, 428, 430 and 432. The graphical display 444 can also be configured as an interactive display box such that a user can use a computer mouse to "click-and-drag" the borders of the selected scan window 446, or to click-and-drag the entire selected window. In this way the scan window can be defined without the use of the input boxes 426, 428, 430 and 432. The user display 422 can also be provided with interactive points (or "buttons") which can be actuated using a computer mouse or the like. For example, the user interface can include a HIGHLIGHT SCAN WINDOW button 434 to cause the scan window illumination device (such as the oscillating mirror configuration 325 of FIGS. 10 and 11) to highlight (i.e., illuminate or trace) the selected scan window on the platen of the scanner (as for example, platen 11 in scanner 300 of FIG. 9). A STOP WINDOW SCANNING button 436 can also be provided to stop the scan window illumination device from illuminating the selected scan window. Once the user has determined that the selected scan window is acceptable, the user can begin the scanning process using the SCAN WINDOW button 438. The user can also terminate the session with the user interface 422 by using the CANCEL button 440.

The scanning program 420 of FIG. 12 can also be used to control the scanning process performed by the scanning device to take advantage of the scan windowing feature.

During the prior art scanning process, the scanning light bar (e.g., 120 of FIG. 6) moves across the entire scanable surface area of the platen. Scanning processes are normally relatively slow processes, and it can take between 2 and 4 seconds for the scanning light bar to move over the entire length of the scanable area. With the present invention, once the scan window has been selected by the user, the scanning light bar can be moved rapidly to the top of the scan window. Then the scan window can be scanned over its defined length by the light bar, and the scanning process can be stopped once the scanning light bar reaches the bottom of the selected scan window. Further, when the scanning light bar comprises a continuous light source (i.e., a light source spanning the entire width of the scanable surface), the processor 410 can be directed (via the scan window program 420) to only collect and store data received from the width of the selected scan window. When the scanning light bar comprises a an oscillating light source configured to oscillate over the width of the scanable surface (such as when a focused light source and a rotating polygonal mirror are used), then the processor 410 can be directed (via the scan window program 420) to illuminate the scanning light source only when the light from the scanning light source is scanned past the width of the selected scan window.

As an alternative to using a single light source and a combination of oscillating mirrors to illuminate the perimeter of the scan window, as depicted in FIGS. 10 and 11, a plurality of light sources can be used. For example, one light source can be used to scan the top and bottom perimeters of the scan window using a first beam scanning galvanometer, and a second light source can be used to scan the left and right perimeters of the scan window using a second beam scanning galvanometer. In yet another variation a plurality of focused light sources and rotating mirrors can be used to illuminate the perimeter of the scan window. We will now describe how this can be accomplished.

Figure 13:
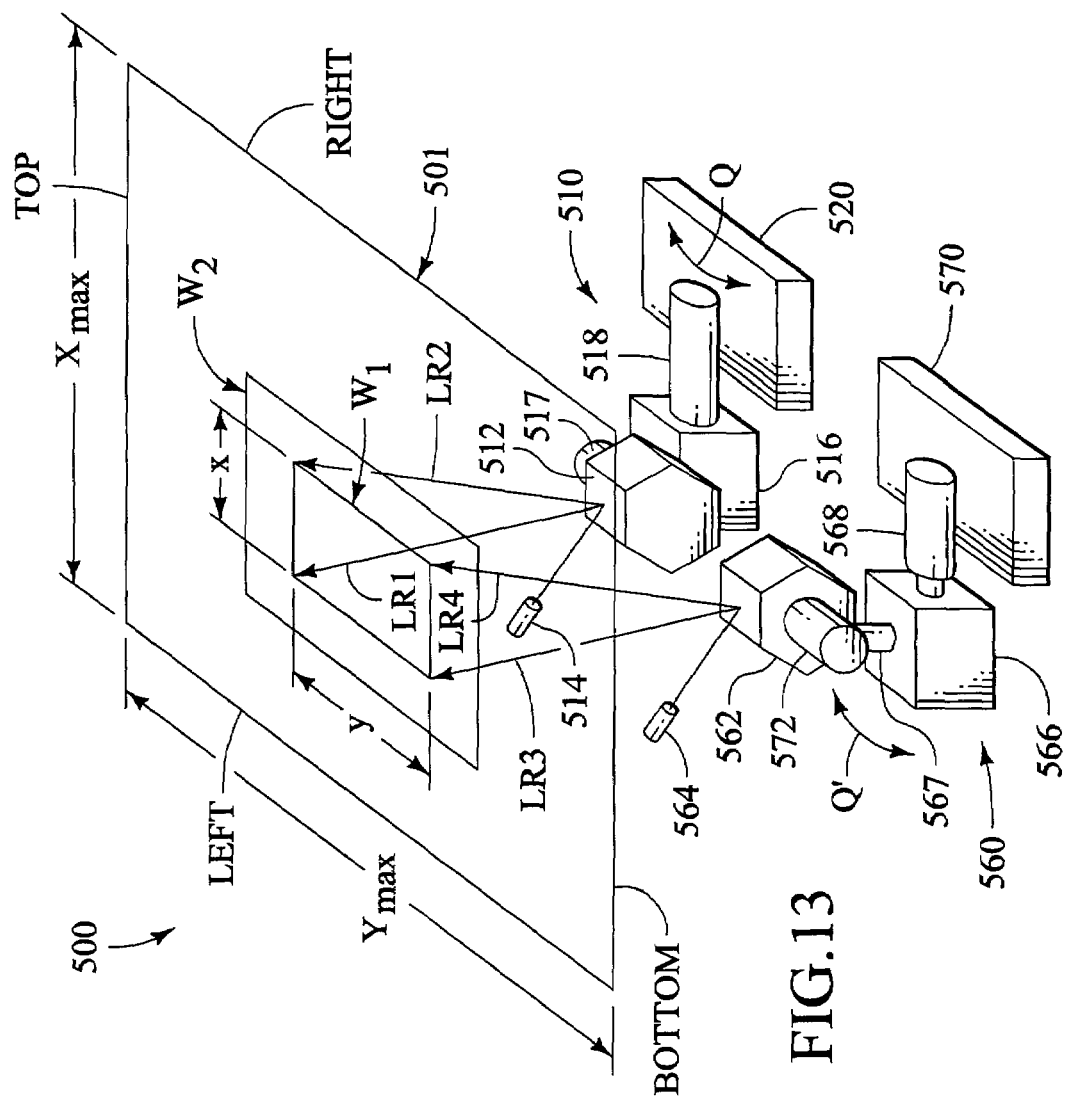
FIG. 13 depicts an oblique view of a partial second scan window illumination device which can be used in a document scanner.

Turning to FIG. 13, a scan window illumination device 500 is depicted which can be used to illuminate four sides of a rectangular perimeter of a scan window W1 defined within an overall scanable area 501. The scan window illumination device 500 uses four focused (or coherent) light sources, and four rotating polygonal mirrors, such that there is one light source and one mirror for each of the four sides of the scan window perimeter. For the sake of simplicity only the top left-right scanning mirror assembly 510 and the bottom left-right scanning mirror assembly 560 are shown. Briefly turning to FIG. 14, a simplified diagram of the scan window illumination device 500 of FIG. 13 is depicted showing the additional scanning mirrors used to scan the two top-to-bottom sides of the scan window perimeter. Polygonal mirror 580 (in conjunction with light source 584) is used to illuminate the right top-bottom perimeter border, and polygonal mirror 582 (in conjunction with light source 586) is used to illuminate the left top-bottom perimeter border. Polygonal mirrors 512 and 562 can rotate about a common axis A1, and polygonal mirrors 580 and 582 can rotate about a common axis A2. In general operation, the polygonal mirrors are first positioned using positioners such that light will be reflected by the rotating mirrors to selected positions corresponding to the positions of the borders of the scan window. The polygonal mirrors can then be continually rotated to cause light beams to be scanned along the borders of the scan window. This will be described more fully below.

Returning now to FIG. 13, the top left-right scanning mirror assembly 510 includes a first light source 514, such as a laser, and a first rotating polygonal mirror 512. The polygonal mirror 512 is rotated by a first motor 517. The motor 517 is mounted to a first pivotable support block 516 which can be pivoted to different positions in the direction of arrow "Q" by the first positioner 518. The positioner 518 can be supported on a first base 520 which can be mounted in a scanning device. Similarly, the bottom left-right scanning mirror assembly 560 includes a second light source 564, such as a laser, and a second rotating polygonal mirror 562. The polygonal mirror 562 is rotated by a second motor 572. The motor 572 is mounted on a second pivotable support block 566 by post 567. The support block 566 can be pivoted to different positions in the direction of arrow Q' by the second positioner 568. The positioner 568 can be supported on a second base 570 which can be mounted in a scanning device. The positioners 518 and 568 can be for example stepper motors allowing discrete increments of motion in the directions Q' and Q. The polygonal mirrors 580 and 582 of FIG. 14 can also be provided with positioners similar to the positioners 518 and 568 of FIG. 13. The function of the positioners will be described further below.

As the polygonal mirrors 512 and 562 rotate, the reflected light beams from the light sources 514 and 564 will be continually scanned in the left and right directions across the respective top and bottom borders of the scan window. For example, light from light source 514 will be scanned by polygonal mirror 512 in the "x" direction from LR1 to LR2 (assuming the mirror 512 rotates in the clockwise direction). This is depicted in FIGS. 14A through 14D which show the polygonal mirror 512 in four different sequential positions as it rotates in the clockwise direction about axis A1. In FIG. 14A the light from laser 514 is reflected by side S1 of polygonal mirror 512 to the position of LR1. As the mirror 512 rotates to the position depicted in FIG. 14B, the light from laser 514 is reflected by side S1 of polygonal mirror 512 to the position of LR2. As the polygonal mirror 512 continues to rotate to the position depicted in FIG. 14C, the light from the laser 512 is reflected by side S1 of polygonal mirror 512 to a position outside of the scan window W1 (of FIG. 13). To prevent illuminating areas of the platen (not shown) which are outside of the scan window (and potentially outside of the scanable surface itself), the laser 514 can be turned off at this point. Once the polygonal mirror 512 rotates to the position depicted in FIG. 14D, light from the laser 514 is no longer reflected from side S1 of the mirror, but from side S2. The causes the reflected light from laser 514 to jump back to the left side of the image. As with the reflected beam of light in FIG. 14C, the reflected light beam in FIG. 14D may be outside of the scan window, as well as outside of the scanable area. The laser can thus be turned off until the polygonal mirror has reached the position depicted in FIG. 14A, at which point it can be turned back on to begin illuminating the scan window top border. In a like manner, light from light source 564 will be reflected by polygonal mirror 562 in the "x" direction from LR3 to LR4, and then back to LR3. The sides of the polygonal mirrors 512 and 562 are preferably sized to allow the light beams from the respective light sources 514 and 564 to be scanned across the entire width of the scanable area (i.e., over the width $X_{MAX}$). Likewise, the sides of the polygonal mirrors 580 and 582 (FIG. 14) are sized to allow the light beams from the respective light sources 584 and 586 to be scanned across the entire length of the scanable area (i.e., over the length $Y_{MAX}$ of FIG. 13). This will result in a scan window perimeter illumination similar to that depicted in FIG. 3 by the dashed lines for the scan window 14.

As suggested above, in order to limit the illumination to only the perimeter of the scan window (e.g., so that only the borders of window W1 of FIG. 13 are illuminated), the light sources 514, 564, 584 and 586 (FIG. 14) can be actuated only during the period that the respective rotating polygonal mirrors 512, 562, 580 and 582 direct the reflected beams of light across the respective perimeters of the scan window. This can be accomplished using scan window position detectors and the scan window program (420 of FIG. 12) in a manner similar to that described above with respect to the oscillating mirror configuration of FIGS. 10 and 11.

The positioners 518 and 568 can be used to reposition the respective polygonal mirrors 512 and 562 to illuminate the defined positions of the respective top and bottom perimeter borders of the selected scan window. Similarly, the positioners (not shown) associated with the polygonal mirrors 580 and 582 of FIG. 14 can be used to reposition the polygonal mirrors 580 and 582 to illuminate the defined positions of the respective right and left perimeter borders of the selected scan window. For example, with reference to FIG. 13, the positioner 518 can be used to rotate the support block 516 (and thus the polygonal mirror 512) in a clockwise direction (as viewed from the right side of the drawing) towards the top edge of the scanable surface 501 to thereby expand the selected window to scan window W2. Similarly, the positioner 518 can be used to rotate the support block 516 in a counter-clockwise direction (as viewed from the right side of the drawing) towards the bottom edge of the scanable surface 501 to thereby decrease the size of the window W1. Accordingly, the mirror surfaces are preferably of such a width (i.e., the dimension along the axes A1 and A2) that they can be repositioned over the intended area of coverage of the platen 11 such that the beams of lights from the respective lasers will at all times be reflected from the mirror surfaces to the platen.

Figure 14:
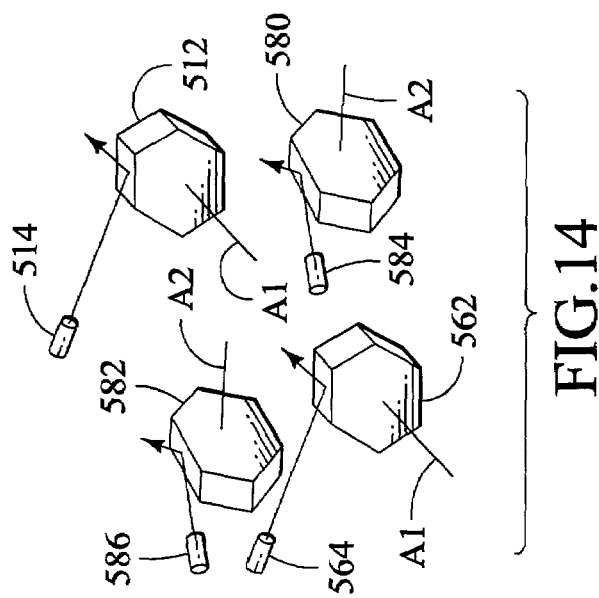
FIG. 14 depicts an oblique diagram showing how four rotating mirrors and light sources can be used in the scan window illumination device of FIG. 13.
Figure 14A:
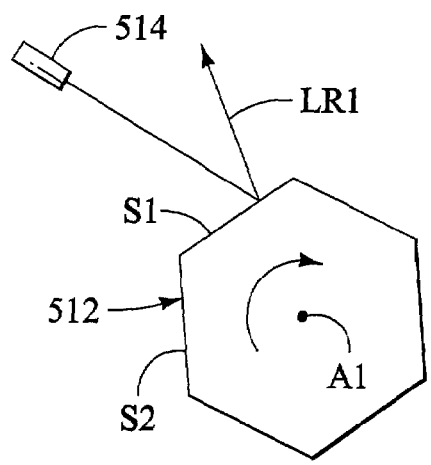
FIGS. 14A, 14B, 14C and 14D depict how one of the rotating mirrors of FIGS. 13 and 14 can be used to illuminate one side of a scan window.
Figure 14B:
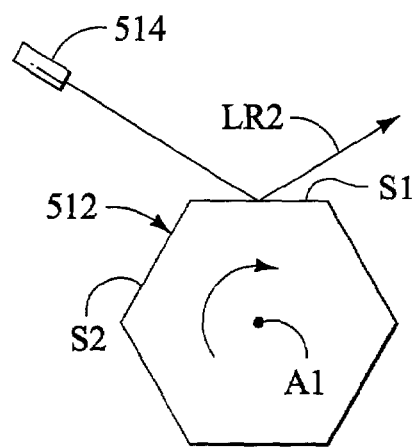
Figure 14C:
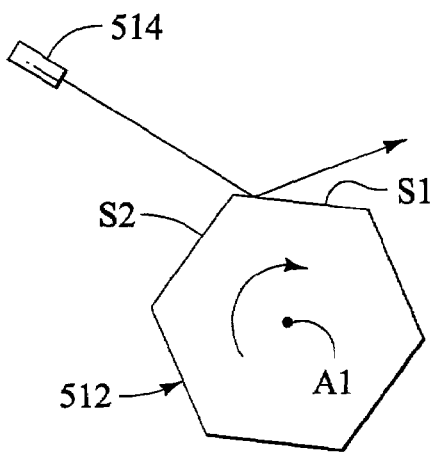
Figure 14D:
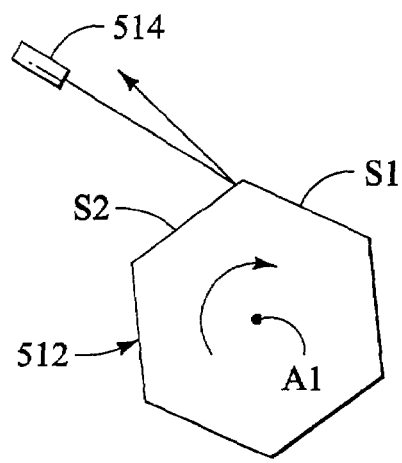

In one variation on the scan window illumination device 500 depicted in FIGS. 13 and 14, rather than providing positioners 518 and 568 to rotate the polygonal mirrors 512 and 562 (and corresponding positioners (not shown) for polygonal mirrors 580 and 582 of FIG. 14), positionable prisms can be used to redirect reflected beams of light from the polygonal mirrors. In this manner the reflected beam of light can be directed closer to (or farther away from) the top, bottom, left and right edges of the scanable surface 501. Further, a beam splitter can be employed to split a light beam from a single light source (e.g., laser 512). The split beam of light can then be used for both the top and bottom perimeter illumination, thus eliminating the requirement for a separate light source 562 for the bottom scan window perimeter illumination. Additional beam splitters can be used to eliminate the need for light sources 584 and 586 of FIG. 14.

Figure 15:
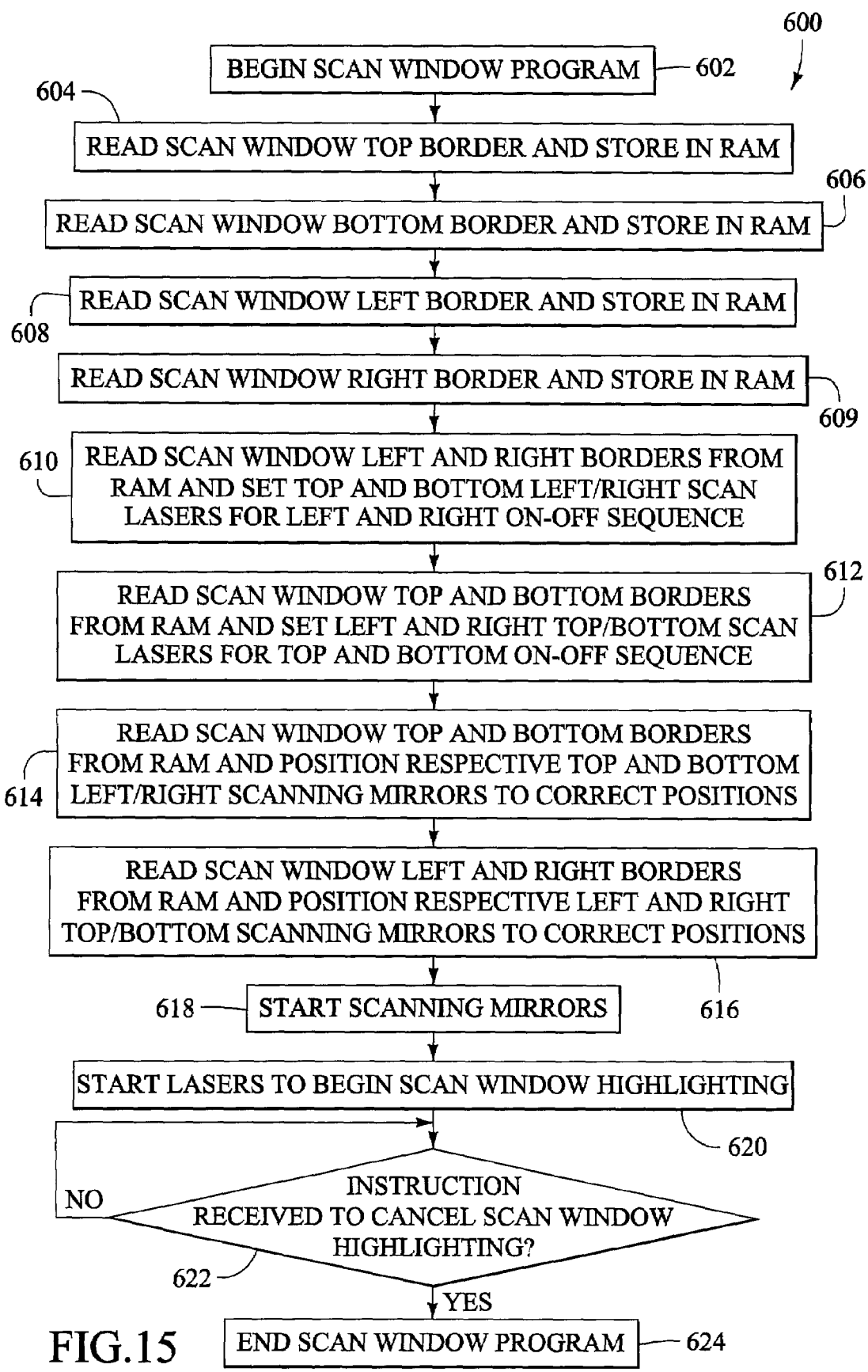
FIG. 15 depicts a flow chart showing how the scan window illumination device of FIGS. 13 and 14 can be operated.

FIG. 15 depicts a flow chart 600 which represents the executable steps of a computer program (such as the scan window program 420 of FIG. 12) which can be used to direct the scan window illumination device 500 of FIGS. 13 and 14 to illuminate the perimeter of a selected scan window. The flow chart 600 assumes that a user has previously defined a scan window, as for example using position markers (e.g., markers 25a, 25b, 26a and 26b of FIG. 3 in conjunction with position detectors 45 and 46 of FIG. 4), or via a user interface, such as user interface 422 of FIG. 16. The following discussion will assume that the user interface 422 of FIG. 16 is used, although it should be understood that the program does not require the use of the user interface 422 in order to be operative.

The program 600 begins at step 602, which can be implemented for example when a user accesses the "HIGHLIGHT SCAN WINDOW" button 434 of FIG. 16. At step 604 the processor (410 of FIG. 12) reads the position of the top border of the selected window as defined by the user (e.g., using the input point 426 of FIG. 16) and stores it in a memory device (such as RAM device 450 of FIG. 12). At step 606 the processor (410 of FIG. 12) reads the position of the bottom border of the selected window as defined by the user (e.g., using the input point 428 of FIG. 16) and stores it in the RAM memory device (450 of FIG. 12). At step 608 the processor (410 of FIG. 12) reads the position of the left border of the selected window as defined by the user (e.g., using the input point 430 of FIG. 16) and stores it in the RAM memory device (450 of FIG. 12). And at step 609 the processor (410 of FIG. 12) reads the position of the right border of the selected window as defined by the user (e.g., using the input point 432 of FIG. 16) and stores it in the RAM memory device (450 of FIG. 12). Then at step 610 the processor (410, FIG. 12) reads the scan widow left and right border information from the RAM device (450, FIG. 12) and sets the top and bottom left-right scan lasers (respectively, lasers 514 and 564 of FIG. 13) for the proper "on-off" sequence to activate and deactivate the lasers to illuminate the top and bottom borders of the selected scan window. At step 612 the processor (410, FIG. 12) reads the scan window top and bottom border information from the RAM device (450, FIG. 12) and sets the left and right top-bottom scan lasers (respectively, lasers 584 and 586 of FIG. 14) for the proper "on-off" sequence to activate and deactivate the lasers to illuminate the left and right borders of the selected scan window.

At step 614 of the flowchart 600 (FIG. 15) the processor (410 of FIG. 12) reads the scan window top and bottom border information from the RAM device (450, FIG. 12) and actuates the respective positioners 518 and 568 to position the left-right scanning mirrors (respectively, mirrors 512 and 562) to the correct positions such that light reflected from the mirrors will illuminate the respective top and borders of the selected scan window. Then, at step 616 of the flowchart 600 the processor (410 of FIG. 12) reads the scan widow left and right border information from the RAM device (450, FIG. 12) and actuates the positioners (not shown) to direct the top-and bottom lasers (respectively, lasers 586 and 584) to the correct positions to illuminate the respective left and right borders of the selected scan window.

Once the on-off sequence of the various lasers (514, 564, 584 and 586) have been set, and the positions of the polygonal scanning mirrors (512, 562, 580 and 582) have been set, then at step 618 the rotation of the scanning mirrors 512, 562, 580 and 582 is initiated. At step the 620 the lasers 514, 564, 584 and 586 are actuated, and the perimeter of the scan window is illuminated by the light beams from the lasers 514, 564, 584 and 586. At step 622 the scan window program (420, FIG. 12) queries to determine if the scan window illumination sequence should continue. If the scan window illuminating sequence is canceled (as for example by using "button" 436 of FIG. 12), then the scan window program is terminated a step 624. However, if the scan window illuminating sequence is not canceled, then the program returns to step 622 of the program, and the scan window perimeter illumination is continued.

It should be understood that the program depicted by the flowchart 600 of FIGS. 15A and 15B is merely exemplary, and that other programs can be used to equal effect to illuminate the perimeter of a scan window using the scan window illuminating devices disclosed herein. Further, the flow chart 600 of FIG. 15 can be modified to accommodate various modifications and variations. For example, rather than the scan window sequence only being terminated by a command from the user at step 622, the scanning device can be configured to also terminate the scan window illumination sequence when the scanning device is actuated (e.g., when the user provides a "copy", "scan", or "send facsimile" command), or when a lid covering the scanner bed (such as lid 18 of FIG. 1) is closed. Further, the program can be modified to allow the scan window illumination to be dynamic such that as the user adjusts the locations and sizes of the scan window borders, the new borders will be illuminated. This can be performed by including a query step following a "No" answer at step 622. The query step would inquire whether any of the scan window borders read at steps 604, 606, 608 and 609 had been changed. If so, the program would be configured to read the new scan window border information and store it in RAM, and then to reposition the polygonal mirrors, or change the on-off sequence for the scanning lasers, such that the new scan window border would be illuminated.

A third embodiment of the present invention provides for a method for identifying a selected scan window (e.g., scan window W1 of FIG. 13) to be scanned as part of an overall scanable surface (e.g., 501, FIG. 13). The method includes the step of defining the selected scan window. This step can be performed using position markers (e.g., markers 25a, 25b, 26a and 26b of FIG. 3, or the user interface 422 of FIG. 16). The method further includes illuminating the scan window prior to scanning the selected scan window to thereby identify the selected scan window. This latter step can be performed using any of the scan window illumination devices described above. For example, the selected scan window can be illuminated by shining a light (e.g., light 132 of FIG. 6, or light 226 of FIGS. 7 and 8) towards the overall scanable surface. The light from the light source (132 or 226) can be diffused before shining the light towards the overall scanable surface (for example by using respective diffusers 134 of FIG. 6 or 228 of FIG. 8).

Further, when the selected scan window is defined by a perimeter (for example, the perimeter defined by the four sides of the scan window W1 of FIG. 13), the method can further include illuminating the scan window by tracing at least a portion of the selected scan window perimeter on the overall scanable surface using at least one directed, focused beam of light. This can be accomplished using the scan window perimeter illumination device 325 of FIGS. 10 and 11 or the scan window perimeter illumination device 500 of FIGS. 13 and 14. The method can further include the step of generating at least two signals to thereby define the traced portion of the selected scan window perimeter. This can be accomplished for example by using a position detector, such as position detector 45 and 46 of FIG. 4, or by using a defined position entered via a user interface, such as user interface 422 depicted in FIG., 16. The generated signals which define at least a portion of the scan window perimeter can then be used to direct the focused beam of light to illuminate at least a portion of the perimeter of the scan window, as for example by the scan window program 420 of FIG. 12. The method can also include the step of scanning only the selected scan window on the scanable surface, as described above.

The present invention further includes a computer readable memory device (such as a compact disc ("CD"), a diskette, a magnetic tape, or a memory chip) containing a series of computer executable instructions for performing the steps to define a selected scan window (as scan window 14 of FIG. 3 or scan window W1 of FIG. 13) and to illuminate the scan window prior to scanning the selected scan window, to thereby identify the selected scan window. The series of computer executable steps can be, for example, the scan window program 420 of FIG. 12. The scan window can be illuminated using any of the scan window illumination devices described above. For example, the executable instructions can include an instruction to illuminate the scan window by shining a light, such as light 132 of FIG. 6, or light 226 of FIGS. 7 and 8, towards the overall scanable surface.

In the case where the scan window is defined by a perimeter, the instructions to illuminate the scan window can further include instructions to trace at least a portion of the selected scan window perimeter on the overall scanable surface using at least one directed, focused beam of light. This can be accomplished by using scan window perimeter information (as for example from a scan window position detector 45 and 46 of FIG. 4, or from the user interface 422 of FIG. 16), in conjunction with a scan window illumination device (such as device 325 of FIGS. 10 and 11, or device 500 of FIGS. 13 and 14). The set of computer executable instructions can also include instructions to scan only the selected scan window on the scanable surface, in the manner described above.

While the above invention has been described in language more or less specific as to structural and methodical features, it is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A scan window apparatus for indicating a scan window within a member of a scanning device, the member having a first side and a second side intersecting the first side, comprising:
    a scan window definition device including a plurality of moveable position markers configured to move along the first side and the second side of the member, and
    a scan window illumination device, wherein at least one of the plurality of moveable position markers includes a light source on the at least one of the plurality of markers and configured to direct light into at least one of the sides of the member.

2. The scan window apparatus of claim 1 and wherein the member comprises an essentially transparent platen defined by a first surface on which an object to be scanned can be placed, and an opposite second surface.

3. The scan window apparatus of claim 1, wherein:
    the member includes a transparent platen having a top surface and a bottom surface; and
    the light sources configured to direct light into at least one of the sides of the member are located proximate to the first side and the second side to allow the light to enter the platen between the top surface and the bottom surface.

4. The scan window apparatus of claim 3, wherein the platen is impregnated with light reflective particles oriented to reflect light from the light sources configured to direct light into at least one of the sides of the member, but to allow light from a scanning light source to freely pass through the platen from the bottom surface to the top surface.

5. A scan window apparatus for indicating a scan window within a scanable surface of a scanning device, the scanable surface having a first edge and a second edge intersecting the first edge and an upper side and a lower side, comprising:
    a scan window definition device to allow a user to define the scan window on the scanable surface; and
    a scan window illumination device including a light source configured to generate a focused beam of light to trace at least part of a perimeter of the scan window by directing the focused beam of light toward at least one of the upper side and the lower side of the scanable surface, wherein the scan window definition device comprises a plurality of moveable position markers configured to move along the first edge and the second edge of the scanable surface and thereby define the scan window, the scan window apparatus further comprising a plurality of position detectors configured to detect the positions of the plurality of position markers along the first and second edges of the scanable surface and to generate position signals in response thereto, and wherein the scan window apparatus is configured to use at least one of the position signals to direct the focused beam of light.

6. A scan window apparatus for indicating a scan window within a scanable surface of a scanning device, the scanable surface having a first edge and a second edge intersecting the first edge and an upper side and a lower side, comprising:
    a scan window definition device to allow a user to define the scan window on the scanable surface; and
    a scan window illumination device including a light source configured to generate a focused beam of light to trace at least part of a perimeter of the scan window by directing the focused beam of light toward at least one of the upper side and the lower side of the scanable surface, further comprising an oscillating mirror, wherein the focused beam of light is generated by a laser and is directed by the oscillating mirror to trace at least a part of the perimeter.

7. A scan window apparatus for indicating a scan window within a scanable surface of a scanning device, the scanable surface having a first edge and a second edge intersecting the first edge and an upper side and a lower side, comprising:
    a scan window definition device to allow a user to define the scan window on the scanable surface; and
    a scan window illumination device including a light source configured to generate a focused beam of light to trace at least part of a perimeter of the scan window by directing the focused beam of light toward at least one of the upper side and the lower side of the scanable surface, further comprising a rotating polygonal-sided mirror, wherein the focused beam of light is generated by a laser and is directed by the rotating polygonal-sided mirror to trace at least a part of the perimeter.

8. An optical scanning device comprising:
    a platen defining a scanable surface, the platen comprising an essentially transparent surface defined by an upper side and a lower side, the scanable surface being defined by a first edge and a second edge orthogonal to the first edge;
    a scanning light source configured to optically scan an object placed proximate the upper side of the platen, the scanning light source being located proximate the lower side of the platen;
    a scan window definition device to allow a user to define a scan window on the platen to be scanned by the scanning light source; and a scan window illumination device comprising a light source configured to generate a focused beam of light to trace at least part of a perimeter of the scan window by directing the focused beam of light toward at least one of the upper side and the lower side of the platen, further comprising an oscillating mirror, wherein the focused beam of light is generated by a laser and wherein the oscillating minor is configured to direct the focused beam of light to trace at least a part of the perimeter.

9. An optical scanning device comprising:

a platen defining a scanable surface, the platen comprising an essentially transparent surface defined by an upper side and a lower side, the scanable surface being defined by a first edge and a second edge orthogonal to the first edge;

a scanning light source configured to optically scan an object placed proximate the upper side of the platen, the scanning light source being located proximate the lower side of the platen;

a scan window definition device to allow a user to define a scan window on the platen to be scanned by the scanning light source: and a scan window illumination device comprising a light source configured to generate a focused beam of light to trace at least part of a perimeter of the scan window by directing the focused beam of light toward at least one of the upper side and the lower side of the platen, further comprising a rotating polygonal-sided mirror, wherein the light source comprises a laser, and wherein the rotating polygonal-sided minor includes a configuration to direct the focused beam of light to trace at least a part of the perimeter.

10. A method of identifying a scan window to be scanned as part of a scanable surface, comprising:

defining the scan window by generating signals to define at least a portion of a perimeter of the scan window for tracing; and tracing the at least a portion of the perimeter of the scan window on the scanable surface by directing at least one focused beam of light based on the generated signals.

* * * * *

UNITED STATES PATENT AND TRADEMARK OFFICE
CERTIFICATE OF CORRECTION

PATENT NO. : 7,221,487 B2  Page 1 of 1
APPLICATION NO. : 09/938893
DATED : May 22, 2007
INVENTOR(S) : Robert Sesek et al.

It is certified that error appears in the above-identified patent and that said Letters Patent is hereby corrected as shown below:

In column 14, line 45, delete "angle $\Theta$" and insert -- angle $\Theta_1$ --, therefor.

In column 14, line 47, delete "angle $\Theta$" and insert -- angle $\Theta_1$ --, therefor.

In column 14, line 52, delete "angle $\Theta$" and insert -- angle $\Theta_1$ --, therefor.

In column 14, line 57, delete "angle $\Theta$" and insert -- angle $\Theta_1$) --, therefor.

In column 23, line 37, in Claim 1, delete "member," and insert -- member; --, therefor.

In column 23, line 43, in Claim 2, after "claim 1" insert -- , --.

In column 23, line 57, in Claim 4, delete "onented" and insert -- oriented --, therefor.

In column 24, line 67, in Claim 8, delete "minor" and insert -- mirror --, therefor.

In column 25, line 15, in Claim 9, delete "source:" and insert -- source; --, therefor.

In column 26, line 5, in Claim 9, delete "minor" and insert -- mirror --, therefor.

Signed and Sealed this

Nineteenth Day of May, 2009

JOHN DOLL
*Acting Director of the United States Patent and Trademark Office*